(12) United States Patent
Hsieh et al.

(10) Patent No.: US 12,062,748 B2
(45) Date of Patent: Aug. 13, 2024

(54) LIGHT-EMITTING DEVICE, MANUFACTURING METHOD THEREOF AND DISPLAY MODULE USING THE SAME

(71) Applicant: EPISTAR CORPORATION, Hsinchu (TW)

(72) Inventors: Min-Hsun Hsieh, Hsinchu (TW); Shau-Yi Chen, Hsinchu (TW); Shao-You Deng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 18/175,395

(22) Filed: Feb. 27, 2023

(65) Prior Publication Data

US 2023/0231098 A1    Jul. 20, 2023

Related U.S. Application Data

(63) Continuation of application No. 16/958,095, filed as application No. PCT/CN2018/090440 on Jun. 8, 2018, now Pat. No. 11,641,010.

(Continued)

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01); *H01L 2933/0066* (2013.01)

(58) Field of Classification Search
CPC ................ H01L 33/62; H01L 25/0753; H01L 2933/0066; H01L 2221/68322; H01L 2221/68363; H01L 21/6835; H01L 24/27; H01L 24/75; H01L 24/92; H01L 24/13; H01L 24/29; H01L 24/32; H01L 24/73;

(Continued)

(56) References Cited

U.S. PATENT DOCUMENTS 7,960,271 B2    6/2011  Takehara et al.
2007/0278513 A1  12/2007  Chikugawa
(Continued)

FOREIGN PATENT DOCUMENTS

CN    101621101 A    1/2010
CN    102347427 A    2/2012
(Continued)

*Primary Examiner* — Mohammad M Choudhry
(74) *Attorney, Agent, or Firm* — MUNCY, GEISSLER, OLDS & LOWE, PC

(57) ABSTRACT

A light-emitting device includes a carrier, a light-emitting element and a connection structure. The carrier includes a first electrical conduction portion. The light-emitting element includes a first light-emitting layer capable of emitting first light and a first contact electrode formed under the light-emitting layer. The first contact electrode is corresponded to the first electrical conduction portion. The connection structure includes a first electrical connection portion and a protective portion surrounding the first contact electrode and the first electrical connection portion. The first electrical connection portion includes an upper portion, a lower portion and a neck portion arranged between the upper portion and the lower portion. An edge of the upper portion is protruded beyond the neck portion, and an edge of the lower portion is protruded beyond the upper portion.

17 Claims, 39 Drawing Sheets

Related U.S. Application Data

(60) Provisional application No. 62/632,732, filed on Feb. 20, 2018, provisional application No. 62/610,426, filed on Dec. 26, 2017.

(58) Field of Classification Search
CPC . H01L 2221/68354; H01L 2221/68368; H01L 2221/68381; H01L 2224/0401; H01L 2224/05611; H01L 2224/05624; H01L 2224/05644; H01L 2224/05647; H01L 2224/111; H01L 2224/11849; H01L 2224/13109; H01L 2224/13147; H01L 2224/16501; H01L 2224/2929; H01L 2224/2932; H01L 2224/29386; H01L 2224/75251; H01L 2224/75252; H01L 2224/75262; H01L 2224/7598; H01L 2224/81136; H01L 2224/81203; H01L 2224/81411; H01L 2224/81424; H01L 2224/81439; H01L 2224/81444; H01L 2224/81447; H01L 2224/81903; H01L 2224/83001; H01L 2224/83136; H01L 2224/83203; H01L 2224/83862; H01L 2224/9221; H01L 2224/95136; H01L 2924/18301; H01L 2924/384; H01L 24/11; H01L 2224/11442; H01L 24/16; H01L 24/743; H01L 24/81; H01L 24/83; H01L 24/95; H01L 24/97; H01L 2224/13111; H01L 2224/13144; H01L 2224/16058; H01L 2224/16225; H01L 2224/2784; H01L 2224/29311; H01L 2224/29339; H01L 2224/29344; H01L 2224/29347; H01L 2224/32225; H01L 2224/73204; H01L 2224/811; H01L 2224/81862; H01L 2224/81001; H01L 2224/81011; H01L 2224/81101; H01L 2224/81191; H01L 2224/81801; H01L 2224/81815; H01L 2224/83192; H01L 2224/83194; H01L 2224/95001; H01L 2924/12041; H01L 33/48; H01L 2933/0033; H01L 33/14; H01L 33/38; H01L 33/483

See application file for complete search history.

(56) References Cited

U.S. PATENT DOCUMENTS

| | | |
|---|---|---|
| 2011/0149493 A1 | 6/2011 | Kwon et al. |
| 2013/0056735 A1 | 3/2013 | Heo et al. |
| 2015/0349225 A1 | 12/2015 | Oh et al. |
| 2016/0133809 A1 | 5/2016 | Kuramoto |
| 2017/0092818 A1* | 3/2017 | Kim .................. H01L 33/486 |
| 2018/0190594 A1 | 7/2018 | Hsu et al. |
| 2019/0157532 A1 | 5/2019 | Meitl et al. |

FOREIGN PATENT DOCUMENTS

| | | |
|---|---|---|
| EP | 2950358 A1 | 12/2015 |
| JP | H0555635 A | 3/1993 |
| JP | 2000022300 A | 1/2000 |
| JP | 2000-277553 A | 10/2006 |
| JP | 2008184489 A | 8/2008 |
| JP | 2016225435 A | 12/2016 |
| KR | 20110126095 A | 11/2011 |
| KR | 20160023328 A | 3/2016 |
| TW | 200717757 A | 5/2007 |
| WO | WO-2017167954 A2 | 10/2017 |

* cited by examiner

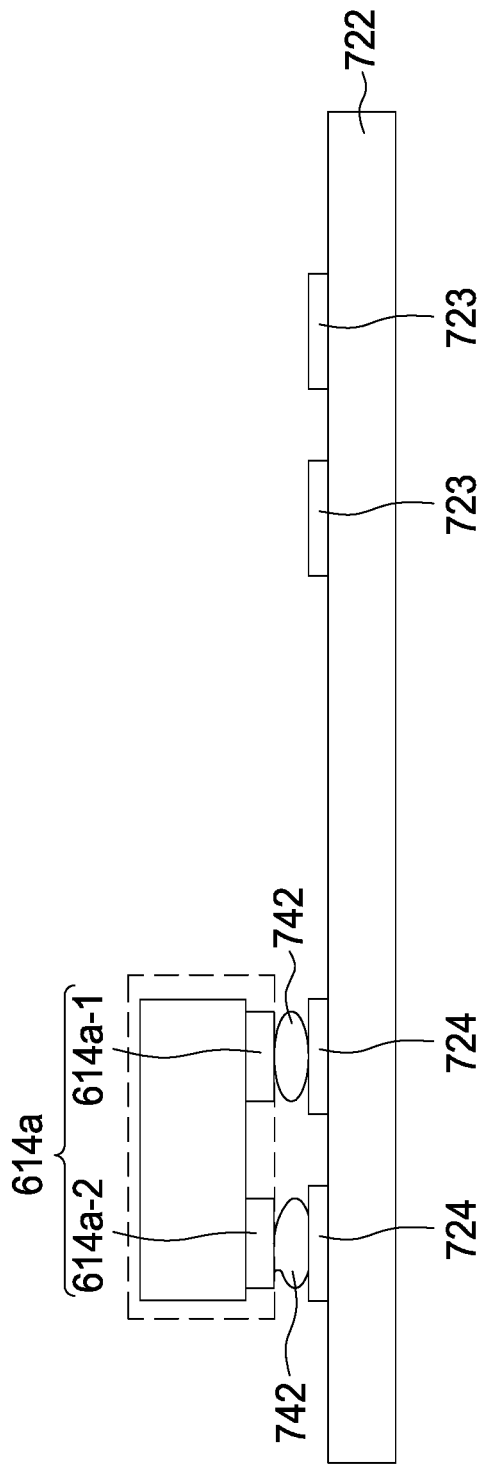
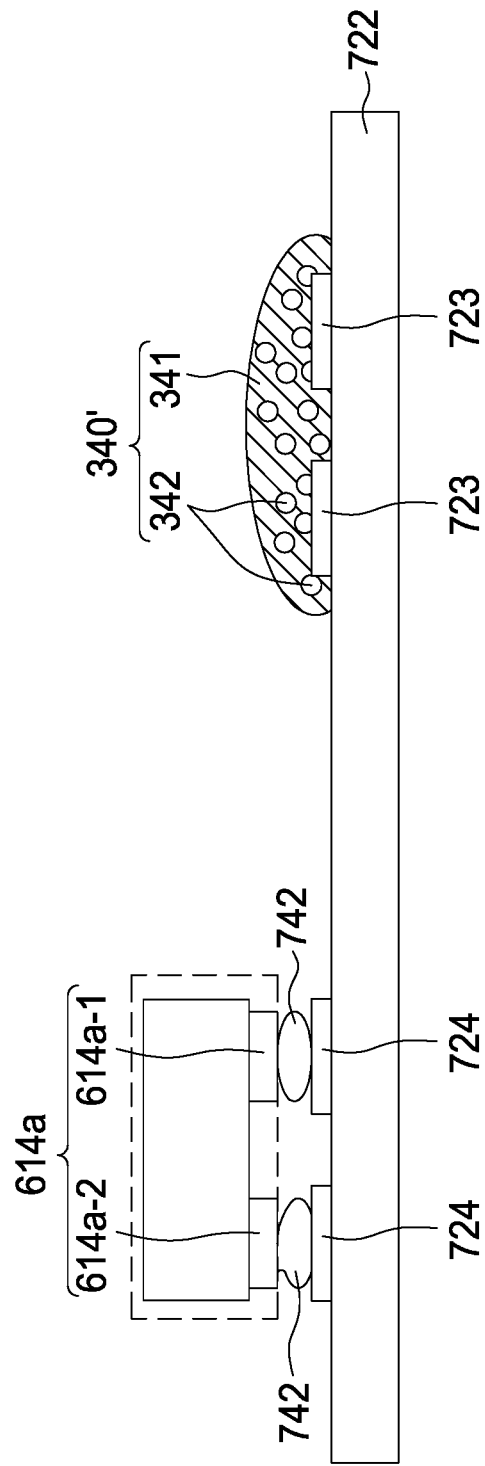
FIG. 7A
FIG. 7B

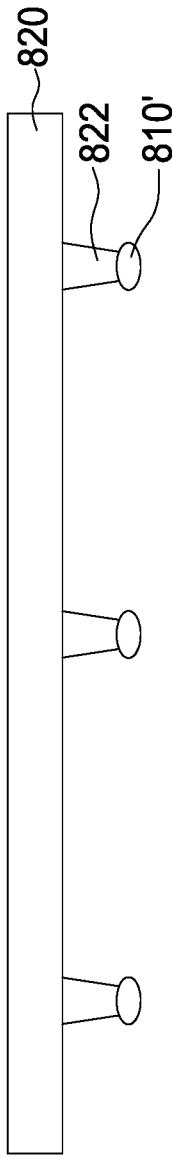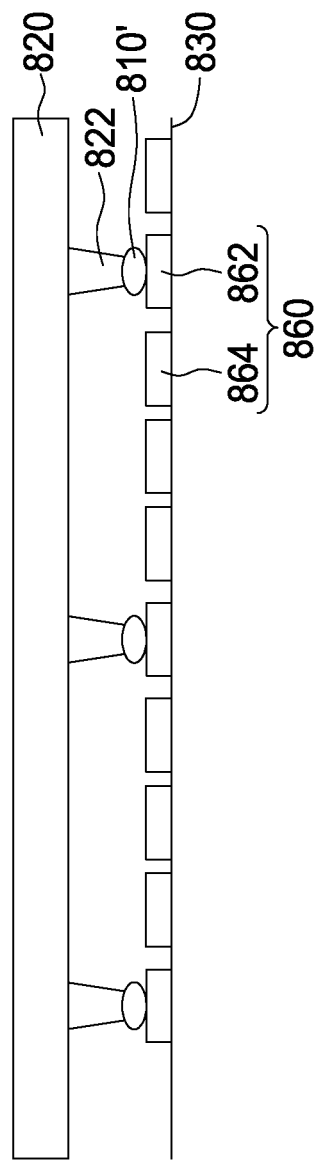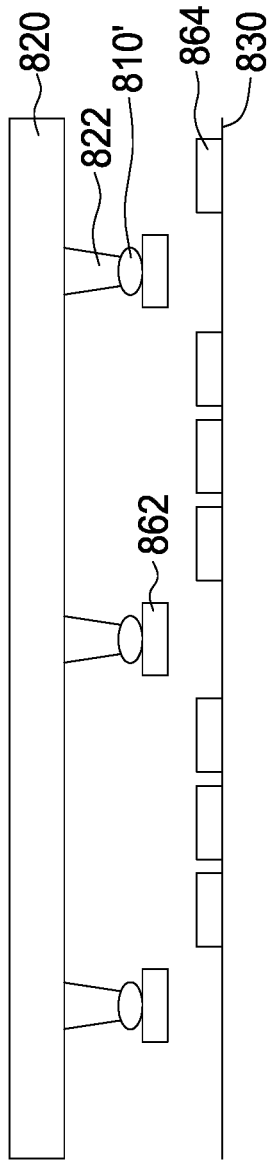

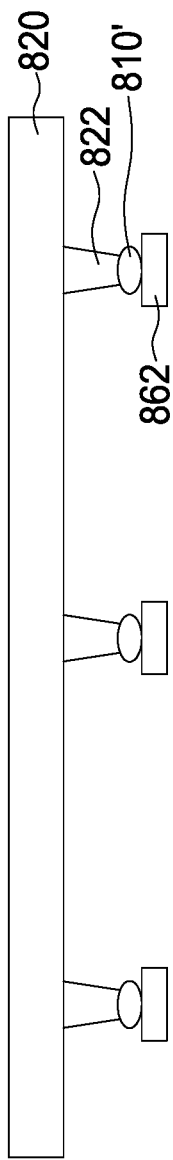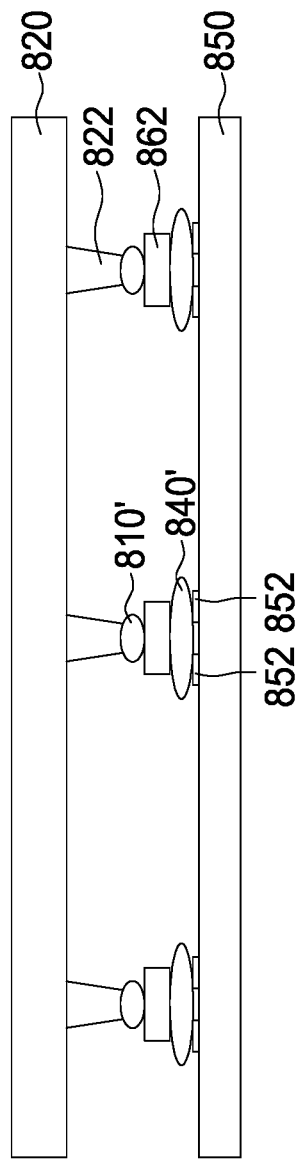
FIG. 8D
FIG. 8E

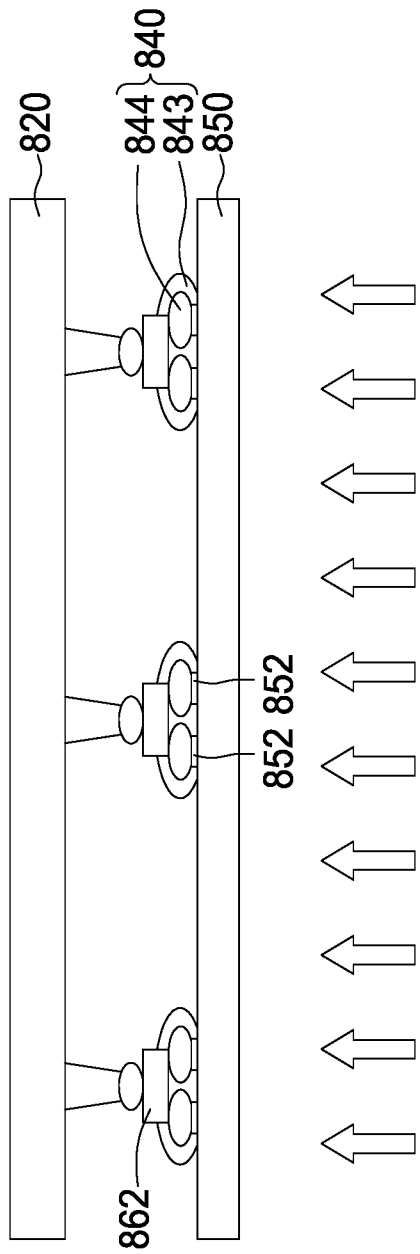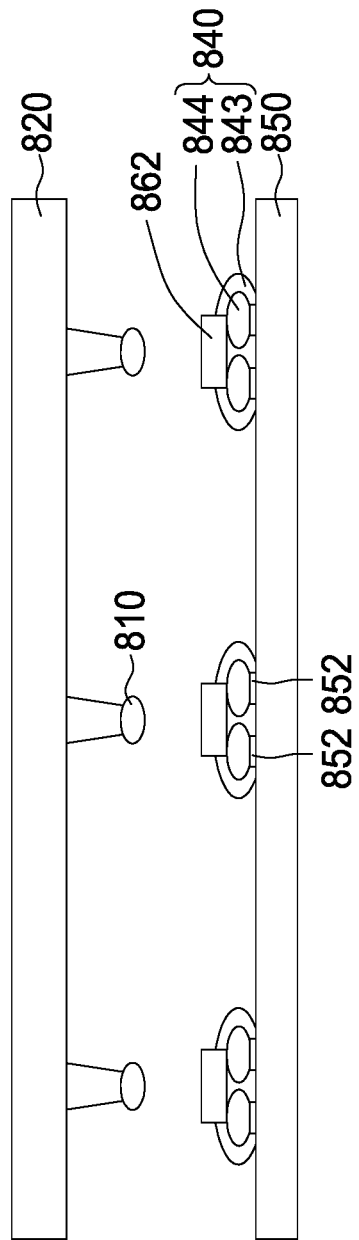

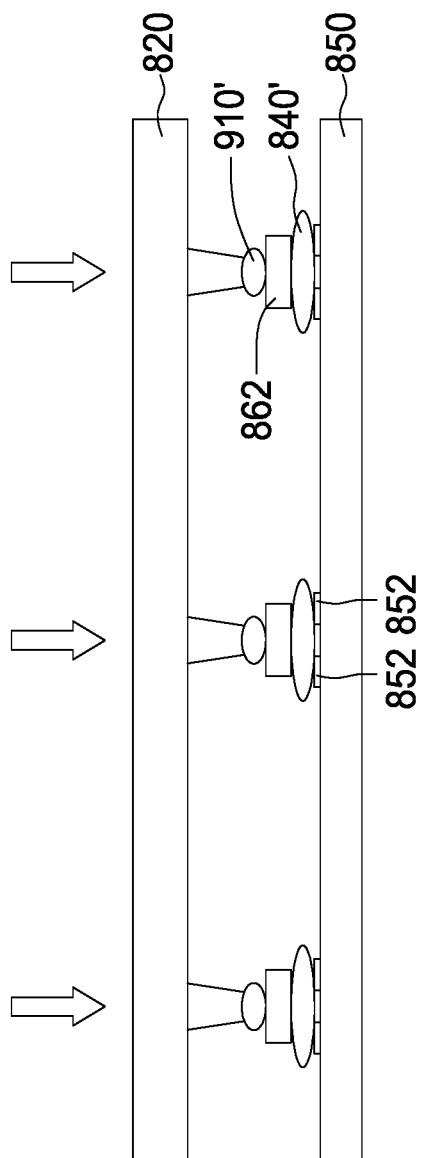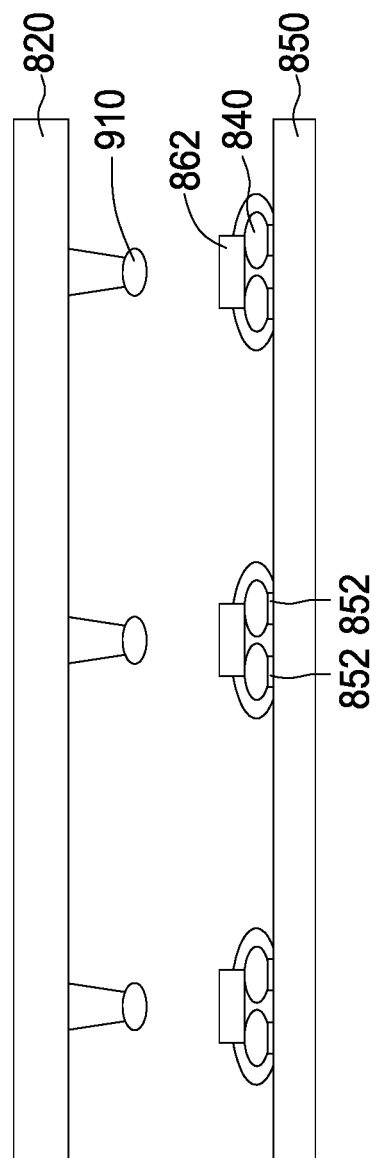

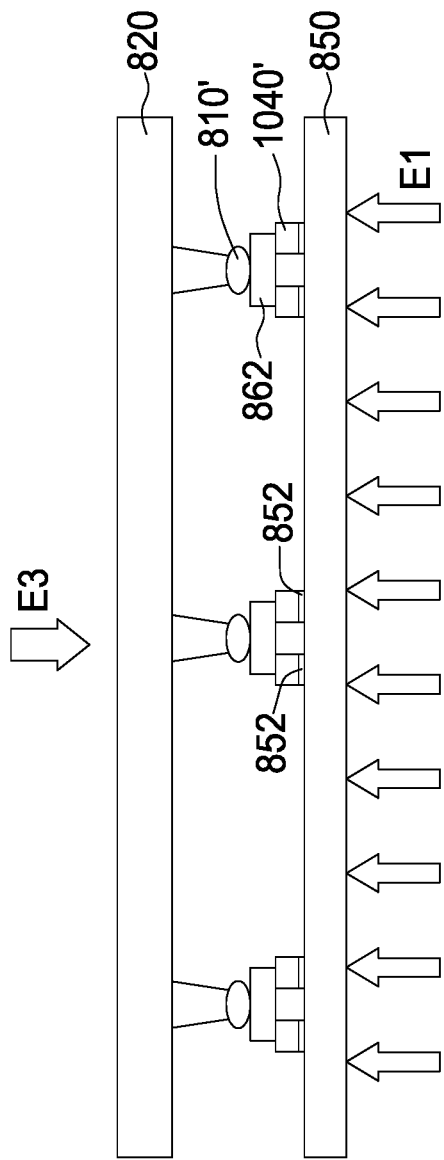
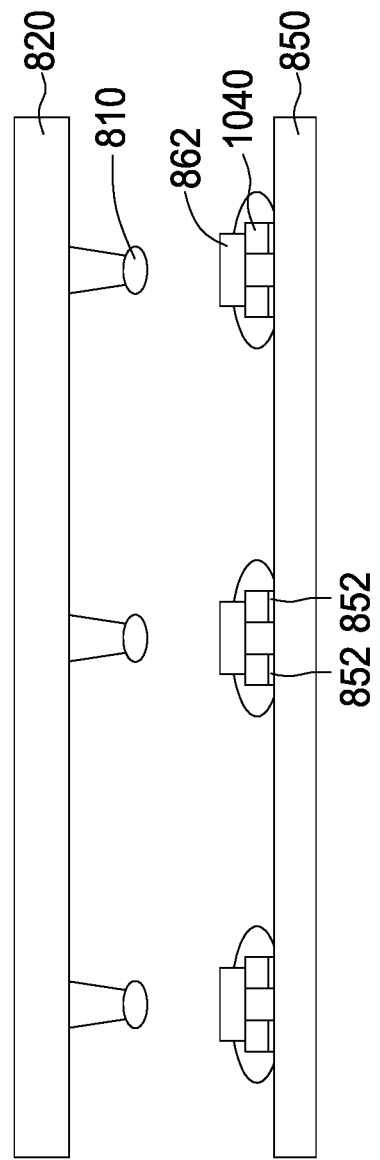
FIG. 10A
FIG. 10B

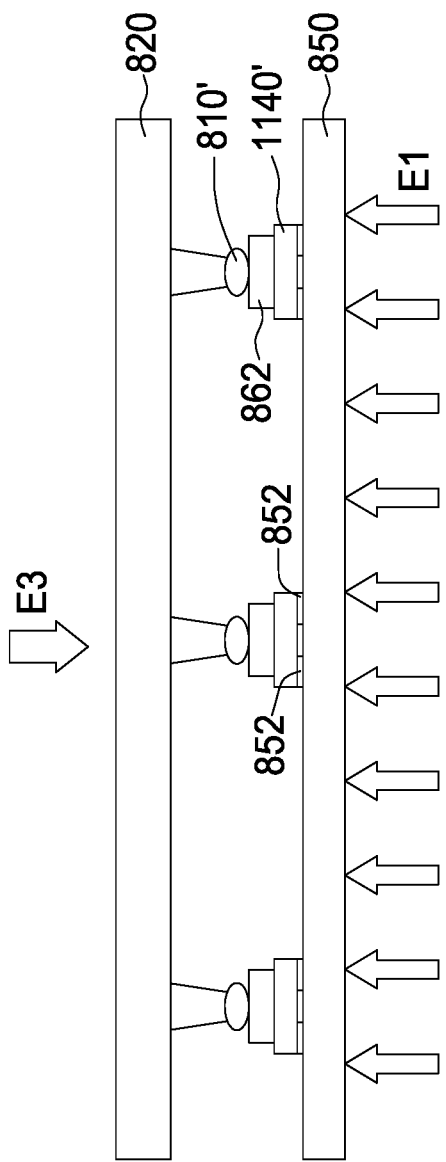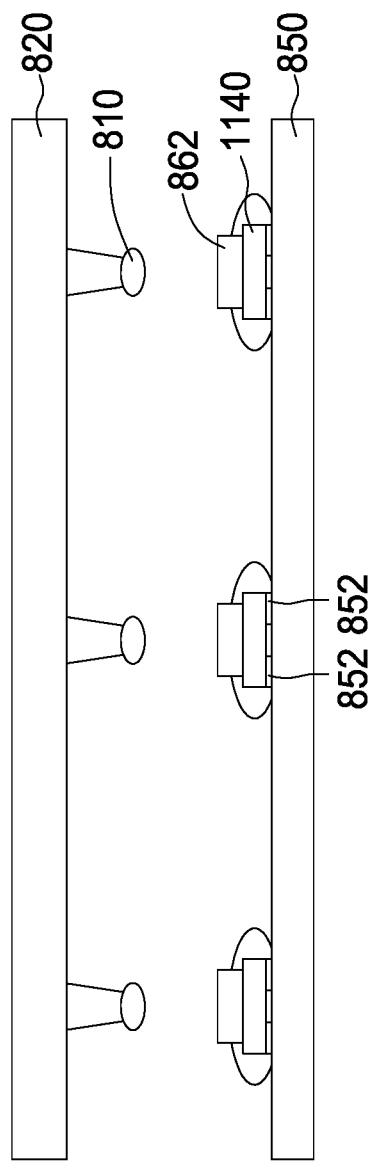

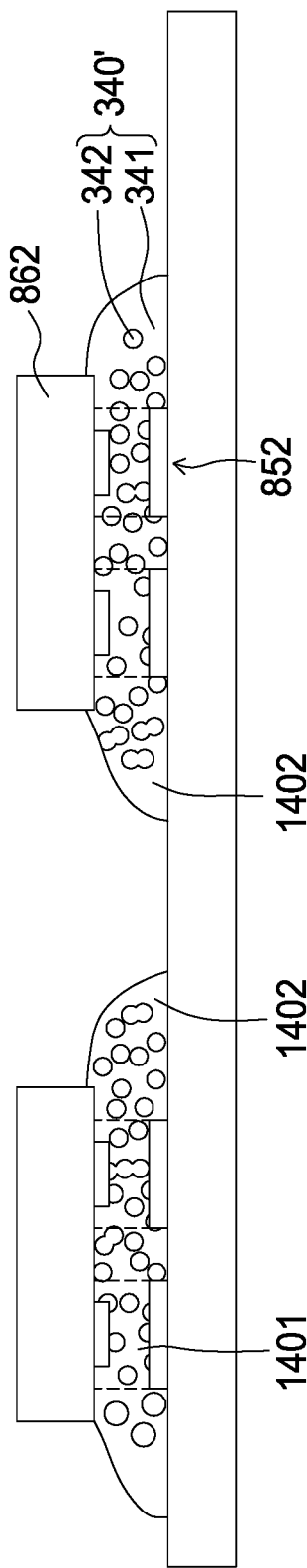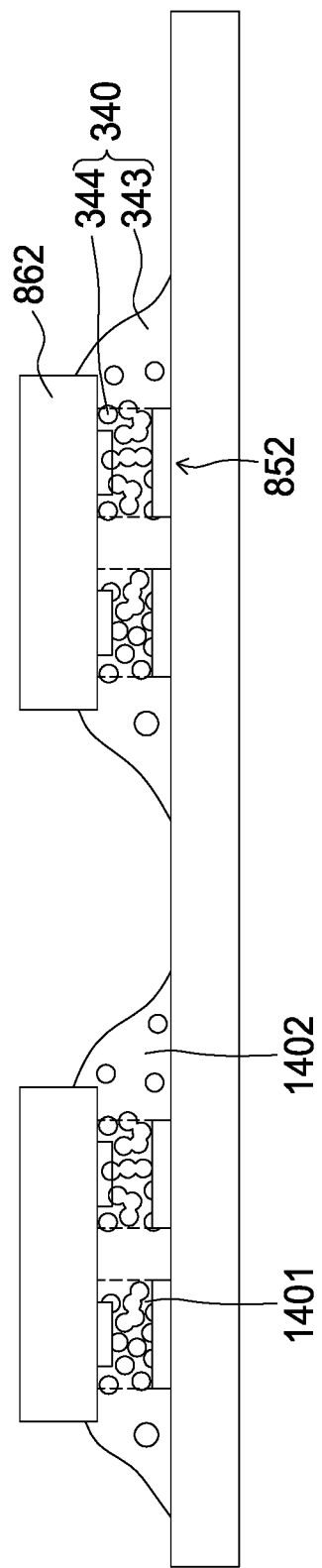

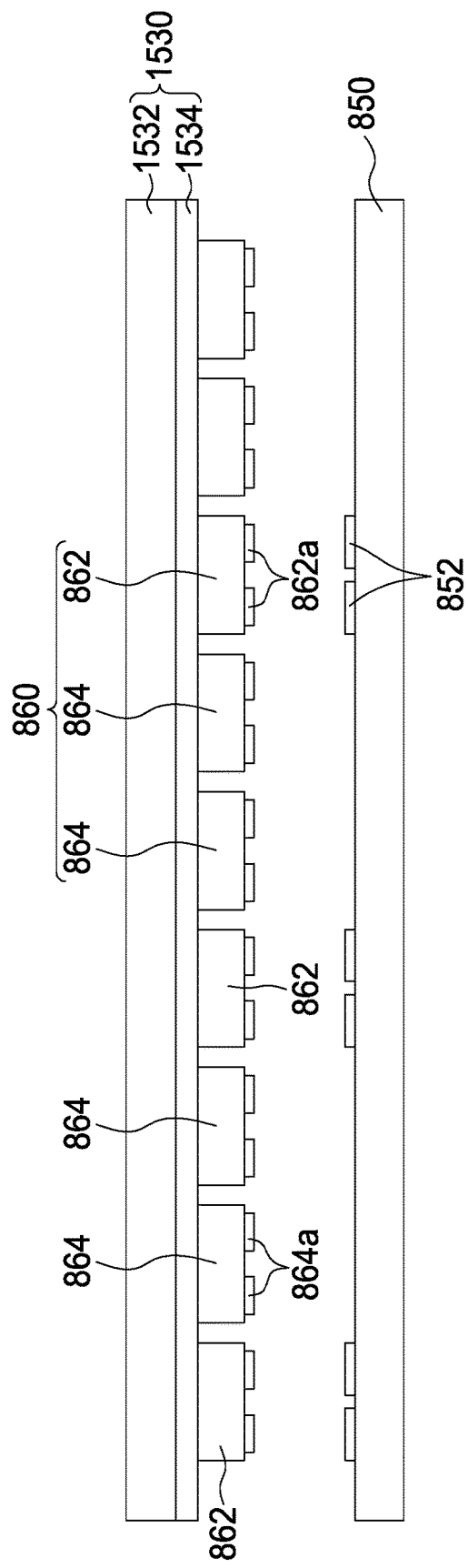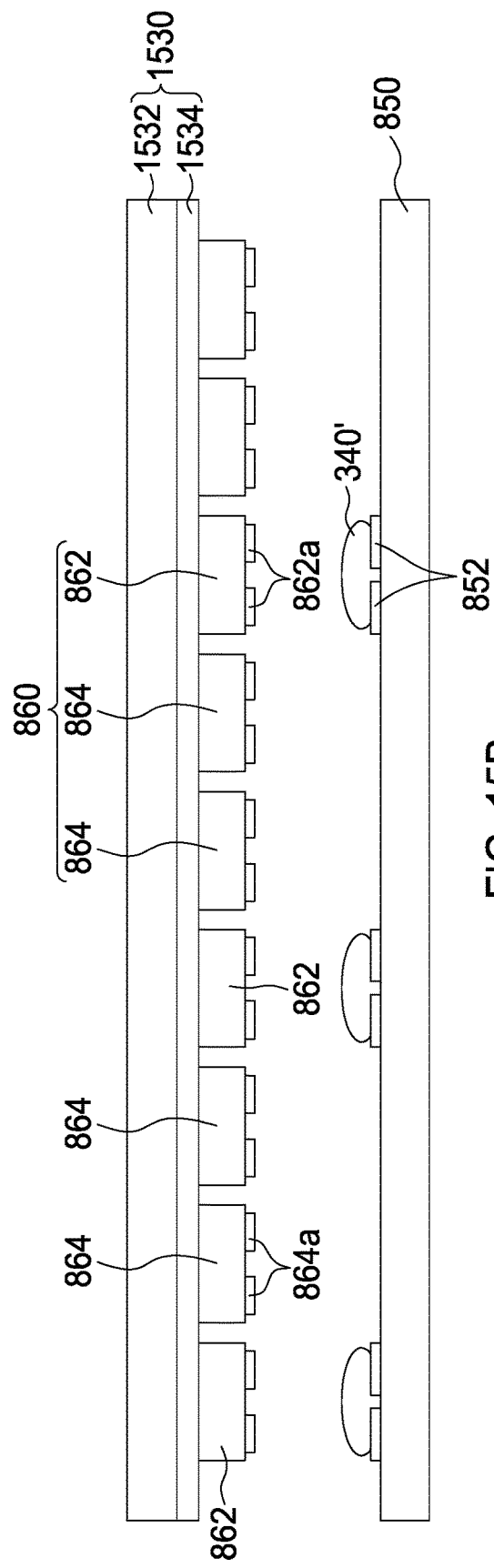
FIG. 15A
FIG. 15B

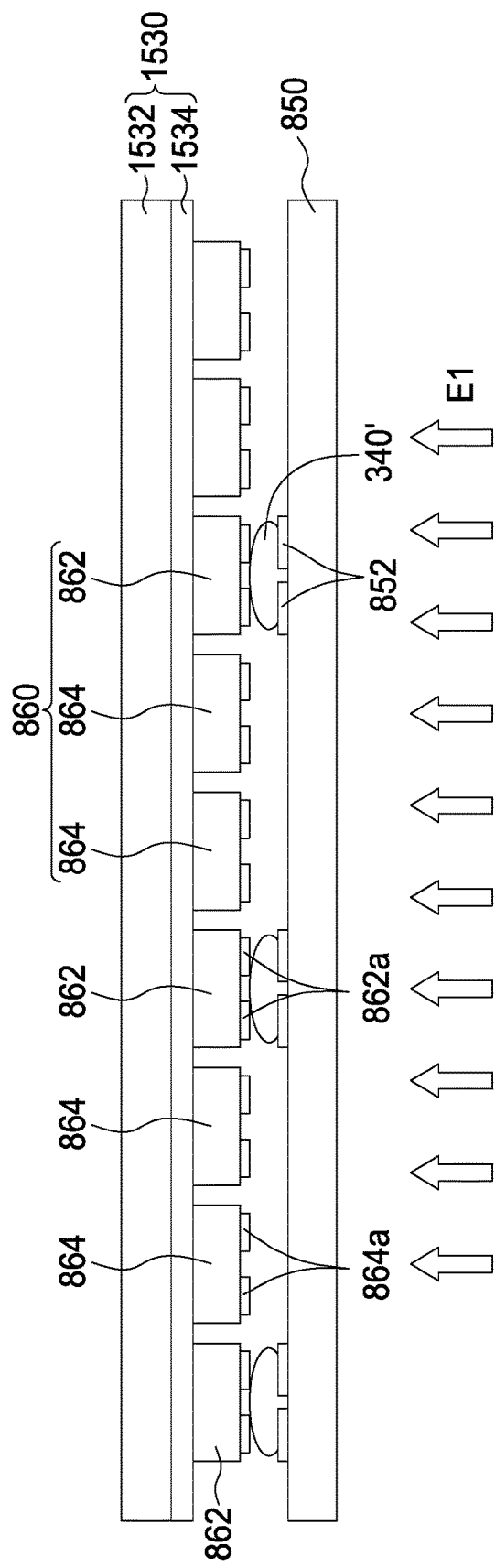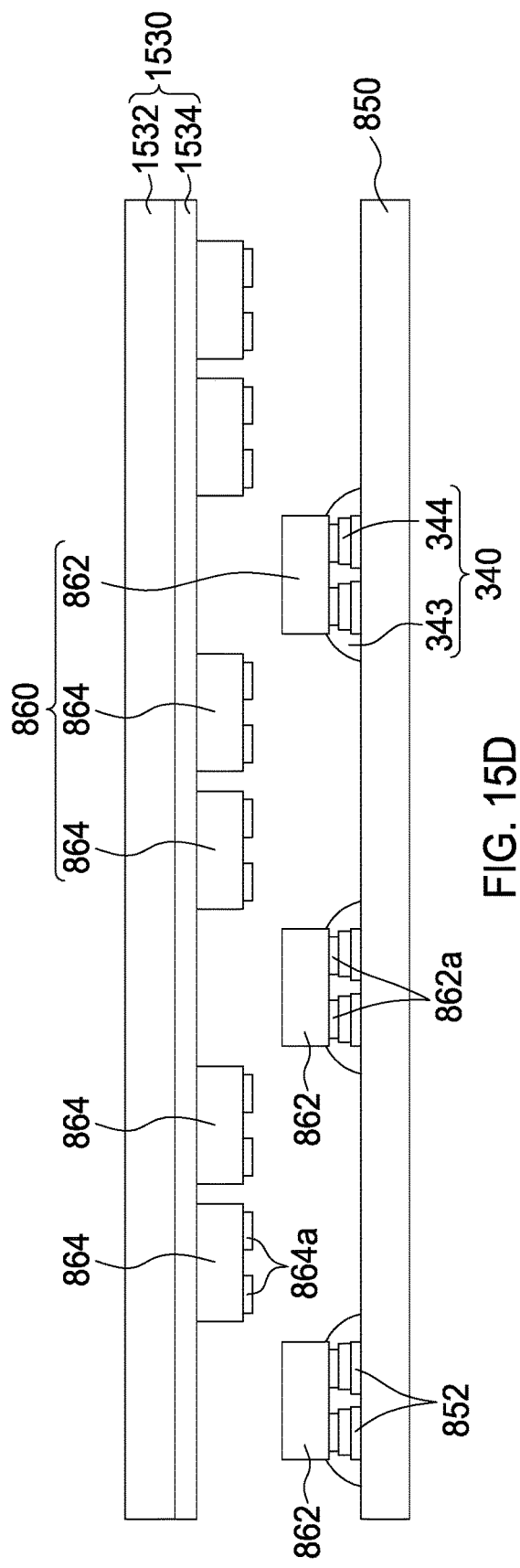

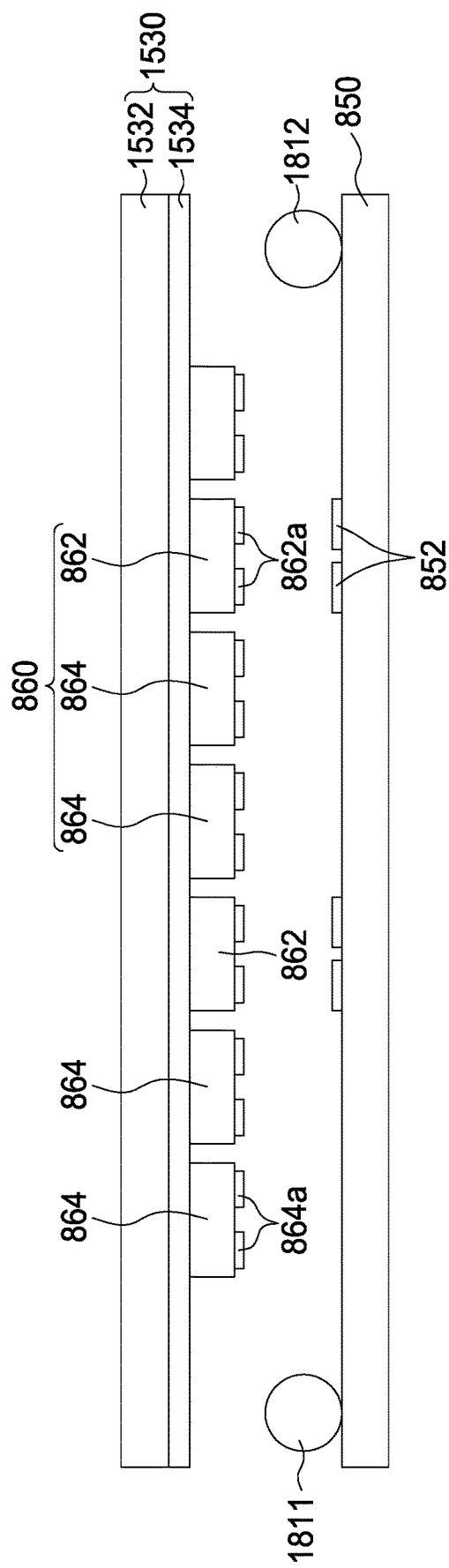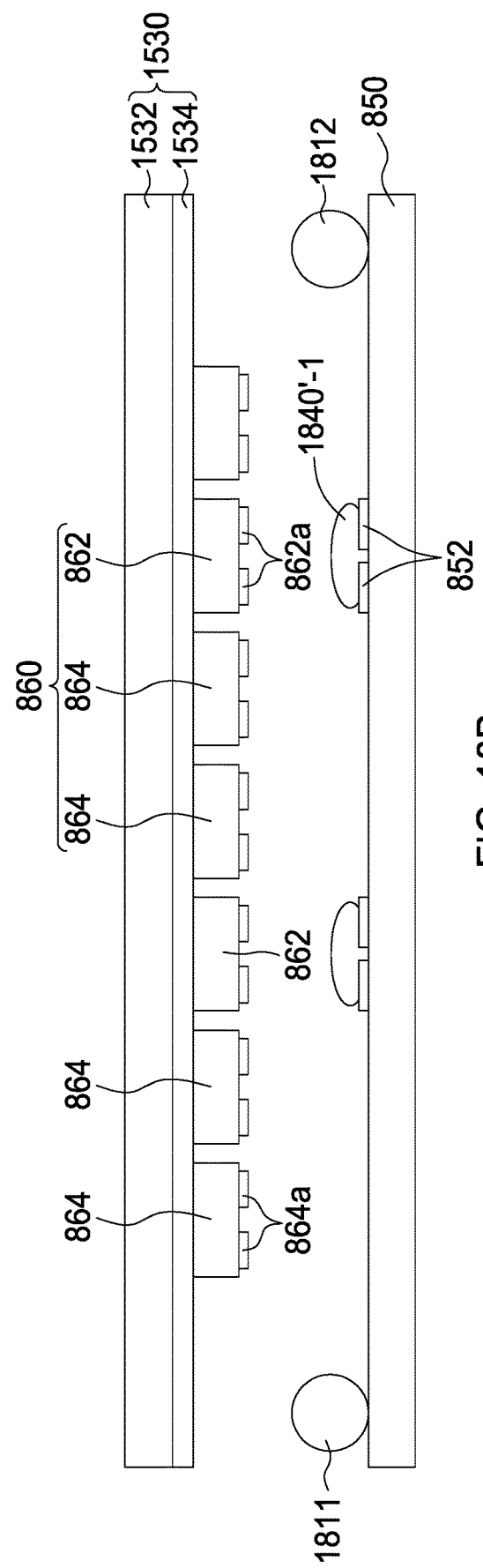
FIG. 18A
FIG. 18B

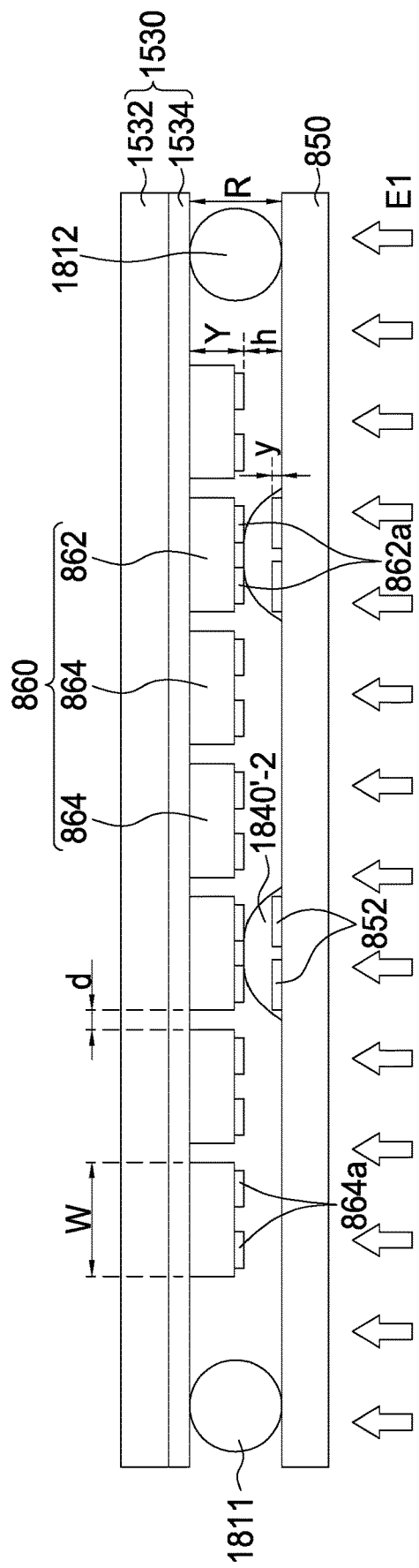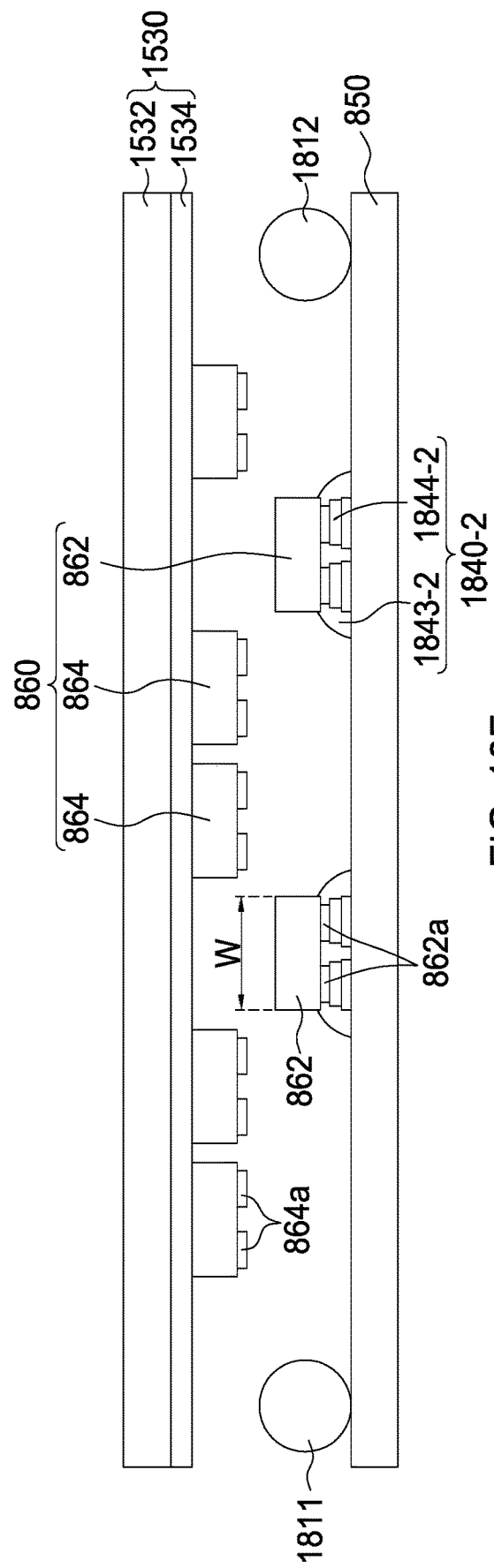
FIG. 18E
FIG. 18F

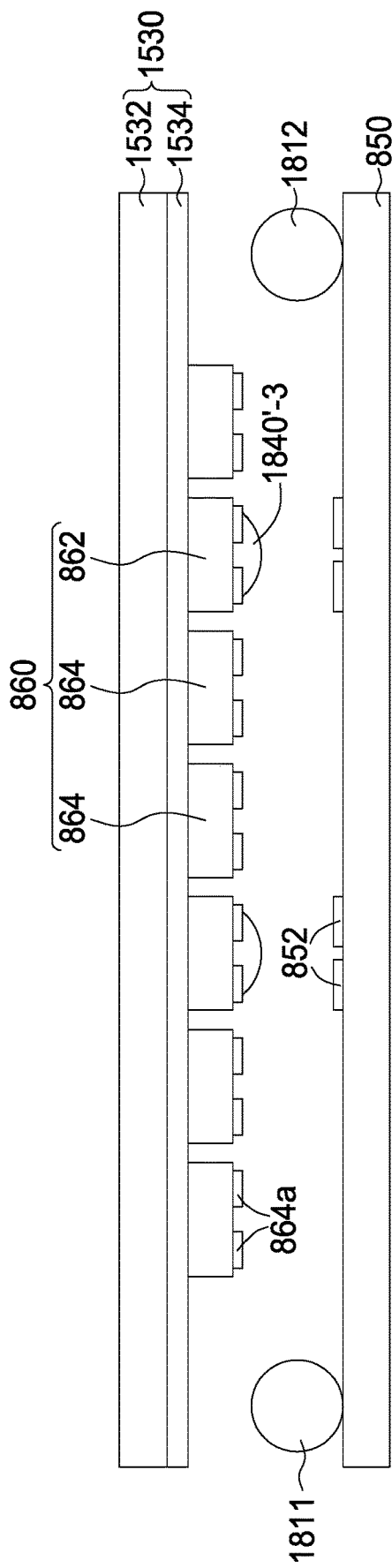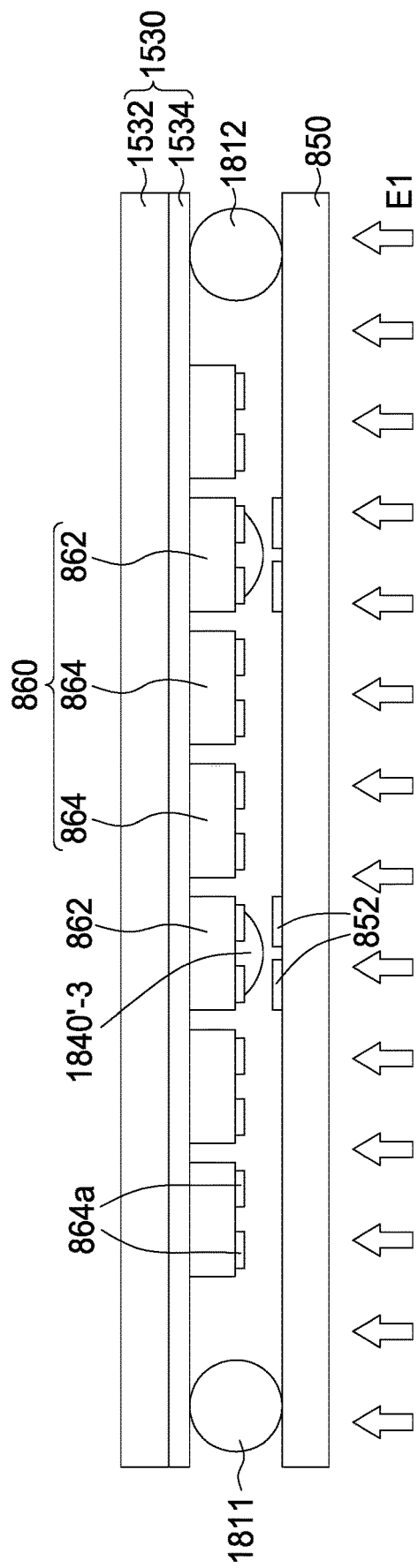

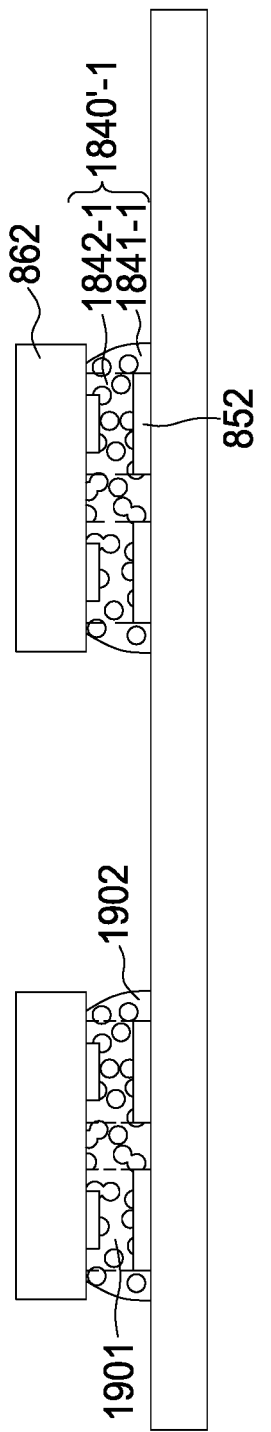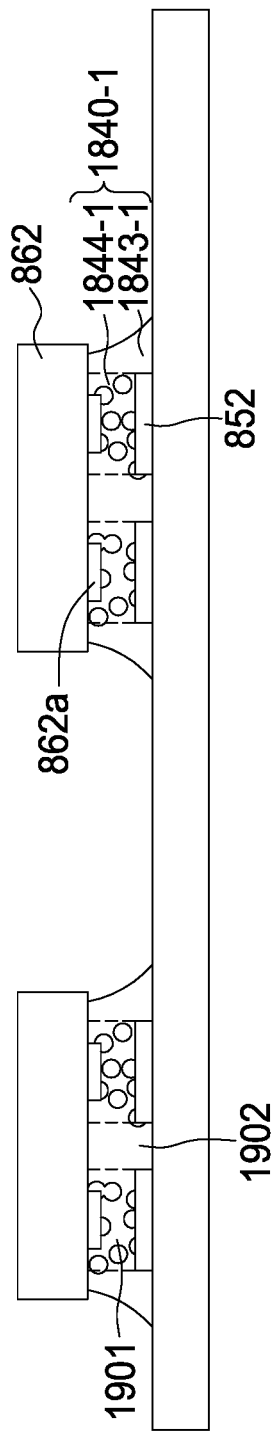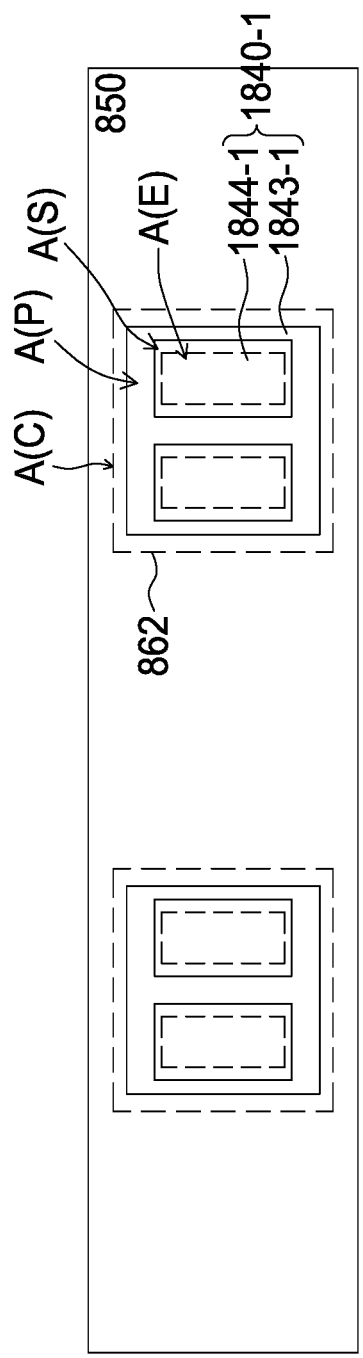

LIGHT-EMITTING DEVICE, MANUFACTURING METHOD THEREOF AND DISPLAY MODULE USING THE SAME

This application is a Continuation of co-pending application Ser. No. 16/958,095, filed on Jun. 25, 2020, which is a national stage of PCT/CN2018/090440, filed on Jun. 8, 2018, which claims priority of U.S. Provisional Application Nos. 62/632,732 and 62/610,426, filed on Feb. 20, 2018 and Dec. 26, 2017, respectively, under 35 U.S.C. § 119(e), the entire contents of all of which are hereby incorporated by reference.

TECHNICAL FIELD

The present disclosure relates to a light-emitting device and a method of manufacturing the same, and more particularly to a light-emitting device including a connection structure of a specific structure and a method of manufacturing the same.

DESCRIPTION OF BACKGROUND ART

Light-Emitting Diode (LED) has low power consumption, low heat generation, long operating lifetime, impact resistance, small size and fast response. It is widely used in various fields where light-emitting elements are required. For example, vehicles, household electric appliances, displays, and lighting fixtures.

LEDs are a type of monochromatic light and therefore are well suitable for being pixels in displays. For example, it can be used as a pixel for an outdoor or indoor display. In order to improve the resolution, it is necessary to transfer more LEDs as pixels to the target substrate, and the yield improvement of the electrical connection between the LEDs and the substrate becomes a big challenge.

SUMMARY OF THE DISCLOSURE

A light-emitting device practiced in accordance with the present disclosure comprises a carrier including a first electrically conductive region and a light-emitting element. The light-emitting includes a first light-emitting layer and a first contact electrode formed under the first light-emitting layer. The first contact electrode is corresponded to the first electrically conductive region. A connection structure includes a first electrical connection portion and a protective portion surrounding the first contact electrode and the first electrical connection portion and the first electrical connection portion is electrically connected with the first electrical portion and the first contact electrode. The first electrical connection portion includes an upper portion, a lower portion and a neck portion located between the upper portion and the lower portion. An edge of the upper portion is protruded beyond the neck portion and an edge of the lower portion is protruded beyond the upper portion.

BRIEF DESCRIPTION OF THE DRAWINGS

FIGS. 3A to 3C and 3F to 3J show the diagrams of manufacturing process of a light-emitting device in accordance with another embodiment of the present disclosure.

FIGS. 7A to 7D show the diagrams of a manufacturing process for repairing a light-emitting module in accordance with an embodiment of the present disclosure.

FIGS. 7A and 7E to 7G show the diagrams of a manufacturing process of repairing a light-emitting module in accordance with another embodiment of the present disclosure.

FIGS. 8A to 8G show the diagrams of a manufacturing process of transferring a plurality of light-emitting elements to a target substrate in accordance with an embodiment of the present disclosure.

FIGS. 9A to 9B show the diagrams of a manufacturing process of transferring a plurality of light-emitting elements to a target substrate in accordance with another embodiment of the present disclosure.

FIGS. 10A to 10B show the diagrams of a manufacturing process of transferring a plurality of light-emitting elements to a target substrate in accordance with another embodiment of the present disclosure.

FIGS. 11A to 11B show the diagrams of a manufacturing process of transferring a plurality of light-emitting elements to a target substrate in accordance with another embodiment of the present disclosure.

FIGS. 14A and 14B show the schematic views of the connection structure before and after curing in the light-emitting device in accordance with another embodiment of the present disclosure.

FIGS. 15A to 15D show the diagrams of a manufacturing process of transferring a plurality of light-emitting elements to a target substrate in accordance with another embodiment of the present disclosure.

FIGS. 15A, 15B, 15E, and 15D show the diagrams of a manufacturing process of transferring a plurality of light-emitting elements to a target substrate in accordance with another embodiment of the present disclosure.

FIGS. 15A, 15B, 15F, and 15D show the diagrams of a manufacturing process of transferring a plurality of light-emitting elements to a target substrate in accordance with another embodiment of the present disclosure.

FIGS. 16D, 16E, and 16C show the diagrams of a manufacturing process of transferring a plurality of light-emitting elements to a target substrate in accordance with another embodiment of the present disclosure.

FIGS. 18A to 18D show the diagrams of a manufacturing process of transferring a plurality of light-emitting elements to a target substrate in accordance with another embodiment of the present disclosure.

FIGS. 18A, 18B, 18E to 18F show the diagrams of a manufacturing process of transferring a plurality of light-emitting elements to a target substrate in accordance with another embodiment of the present disclosure.

FIGS. 18A, 18G to 18I show the diagrams of a manufacturing process of transferring a plurality of light-emitting elements to a target substrate in accordance with another embodiment of the present disclosure.

FIGS. 19A to 19B show the schematic views of the connection structure before and after curing in the light-emitting device disclosed in FIGS. 18A to 18D.

FIG. 19C shows a top view of a light-emitting device disclosed in FIG. 18D.

DETAILED DESCRIPTION OF THE PRESENT DISCLOSURE

Figure 1A:
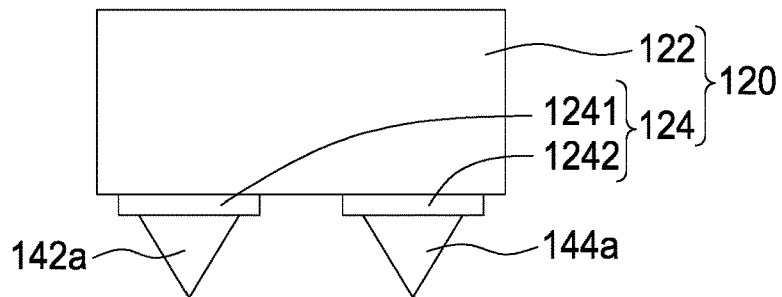
FIG. 1A shows a cross-sectional view of a light-emitting element in accordance with an embodiment of the present disclosure.
Figure 1B:
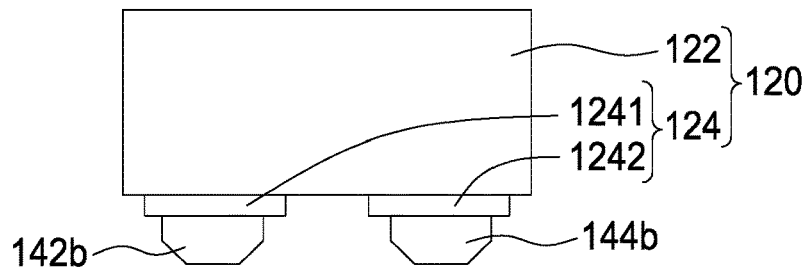
FIG. 1B shows a cross-sectional view of a light-emitting element in accordance with another embodiment of the present disclosure.
Figure 1C:
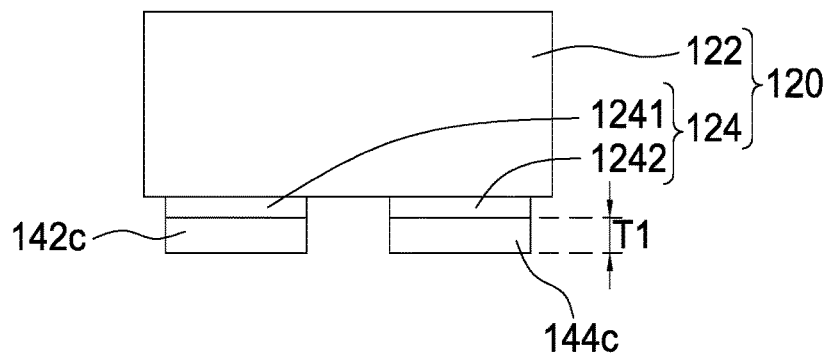
FIG. 1C shows a cross-sectional view of a light-emitting element in accordance with another embodiment of the present disclosure.

FIG. 1A is a cross-sectional view of a light-emitting element 100A in accordance with an embodiment of the present disclosure. FIG. 1B shows a cross-sectional view of a light-emitting element 100B in accordance with another embodiment of the present disclosure. FIG. 1C shows a cross-sectional view of a light-emitting element 100C in accordance with another embodiment of the present disclosure. Referring to FIG. 1A, the light-emitting element 100A includes a light-emitting unit 120 and bumps 142a and 144a. In an embodiment, the light-emitting unit 120 includes a light-emitting stack 122 and contact electrodes 124. The contact electrodes 124 have a pair of 1241 and 1242, and the bumps 142a and 144a are respectively electrically connected to the contact electrodes 1241 and 1242.

The light-emitting stack 122 can emit light after being provided with external power (not shown). The bumps 142a, 144a can serve as a bridge between the light-emitting stack 122 and the external power and can be used as a part of the connection structure for the light-emitting device. In an embodiment, the bump 142a is directly formed under the contact electrode 1241 and the width of the upper surface of the bump 142a near the contact electrode 1241 is wider than the width of the lower surface of the bump 142a away from the contact electrode 1241. In an embodiment, the width of the bump 142a is gradually narrowed from the upper surface to the lower surface so the shape can be a cone shape or a pyramid shape. In an embodiment, the bump 142a has a structure such as a needle or a tube near the lower surface. In an embodiment, the material of the bump 142a is an electrically conductive material such as metal or electrically conductive polymer. In an embodiment, the metal comprises gold, copper, gold alloy or copper alloy. The shape or material of the bump 144a and the bump 142a may be the same or similar.

Referring to FIG. 1B, the light-emitting element 100B includes a light-emitting unit 120 and bumps 142b, 144b. The difference from the light-emitting element 100A is in the shape of the bumps 142b, 144b. The shape of the bumps 142b, 144b may have a flat region on the lower surface, for example, truncated cone shape or truncated pyramid shape.

Referring to FIG. 1C, the light-emitting element 100C includes a light-emitting unit 120 and bumps 142c, 144c. The difference from the light-emitting element 100A is in the bumps 142c, 144c. In an embodiment, the bumps 142c, 144c are separately formed as a film under the lower surface of the contact electrodes 1241, 1242. In an embodiment, the bumps 142c, 144c have a thickness T1 about 1 to 12 microns. In another embodiment, the bumps 142c, 144c have a thickness T1 about 2 to 10 microns. The material of the bumps 142c, 144c may be metal having a low melting point or alloy having a low liquidus melting point. Moreover, the above-mentioned metal is, for example, tin (Sn) or indium (In), and the above-mentioned alloy is, for example, a gold-tin alloy. In an embodiment, each of the bumps 142c, 144c has a flat bottom surface and the light-emitting element 100C can be placed smoothly on the carrier during subsequent bonding process with the carrier.

Figure 2A:
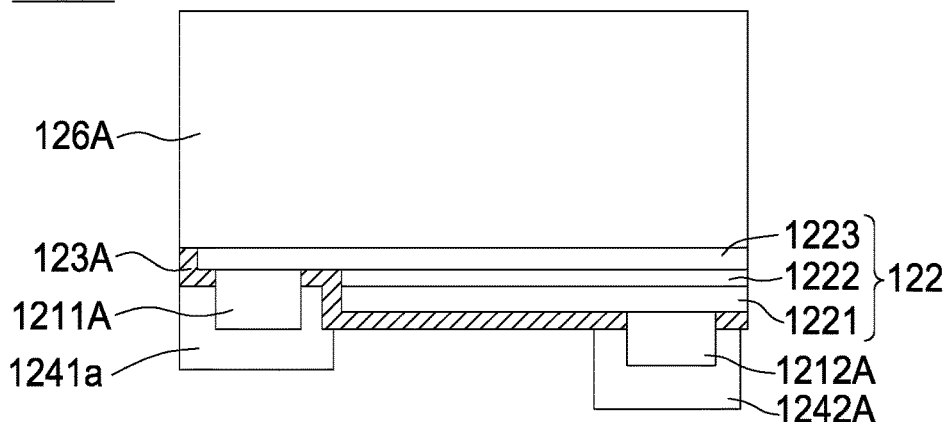
FIG. 2A shows a cross-sectional view of a light-emitting unit in accordance with an embodiment of the present disclosure.
Figure 2B:
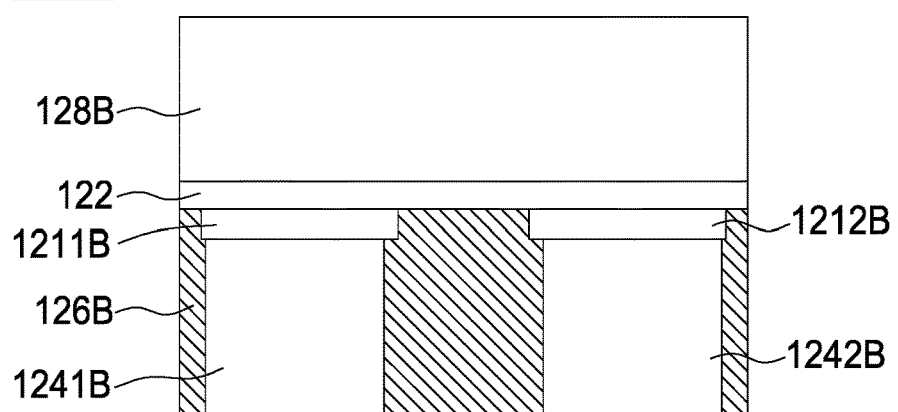
FIG. 2B shows a cross-sectional view of a light-emitting unit in accordance with another embodiment of the present disclosure.
Figure 2C:
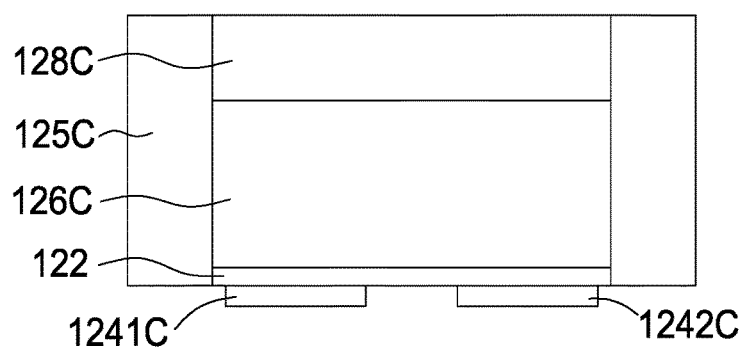
FIG. 2C shows a cross-sectional view of a light-emitting unit in accordance with another embodiment of the present disclosure.

FIG. 2A shows a cross-sectional view of a light-emitting unit 120A in accordance with an embodiment of the present disclosure. FIG. 2B shows a cross-sectional view of a light-emitting unit 120B in accordance with another embodiment of the present disclosure. FIG. 2C shows a cross-sectional view of a light-emitting unit 120C in accordance with another embodiment of the present disclosure. The light-emitting unit 120 shown in FIGS. 1A-1C may be one of the light-emitting units 120A, 120B or 120C. Referring to FIG. 2A, the light-emitting unit 120A includes conductive pads 1211A, 1212A, a light-emitting stack 122, an insulating layer 123A (also referred to as a first insulating layer), contact electrodes 1241A, 1242A, and a carrier substrate 126A. In particular, the light-emitting stack 122 sequentially includes the first semiconductor 1221, the light emitting layer 1222 and the second semiconductor 1223 from bottom to top, and light-emitting stack 122 is located below the carrier substrate 126A. The conductive pads 1211A and 1212A is respectively electrically connected to the first semiconductor 1221 and the second semiconductor 1223. The insulating layer 123A is located below the light-emitting stack 122 and between the two conductive pads 1211A, 1212A. The contact electrodes 1241A and 1242A are respectively electrically connected to the conductive pads 1211A and 1212A. Contact electrodes 1241A, 1242A have a larger bottom surface area or width relative to conductive pads 1211A, 1212A so that be easier connected to external electrodes (not shown).

The light-emitting unit 120A can be a light-emitting diode die. In an embodiment, the light-emitting unit 120A is a red light emitting diode die, which can be powered through a power source and emit a light (or referred as first light), and the dominant wavelength or peak wavelength of the light is between 600 nm and 660 nm. In another embodiment, the light-emitting unit 120A is a green light emitting diode die and emit a light (or referred as first light) that the dominant wavelength or peak wavelength is between 510 nm and 560 nm. In another embodiment, the light-emitting unit 120A is a blue light emitting diode die and emit a light (or referred as first light) that the dominant wavelength or peak wavelength is between 430 nm and 480 nm. In an embodiment, the carrier substrate 126A of the light-emitting unit 120A is a growth substrate for epitaxial growth of the light-emitting stack 122. The material of the growth substrate, for example, is sapphire. In another embodiment, the carrier substrate 126A is a transparent ceramic substrate, and is connected to the light-emitting stack 122 through a bonding layer (not shown). The material of the transparent ceramic substrate, for example, is alumina (aluminum oxide). The material of the conductive pads 1211A, 1212A may comprise a highly conductive metal such as aluminum. The material of the contact electrodes 124a, 124b may comprise a highly conductive metal or alloy, such as aluminum, copper, gold or gold-tin alloy.

Referring to FIG. 2B, the light-emitting unit 120B includes conductive pads 1211B, 1212B, a light-emitting stack 122, contact electrodes 1241B, 1242B, a carrier substrate 126B and a wavelength conversion layer 128B. In an embodiment, the light-emitting stack 122 is electrically coupled to the contact electrodes 1241B and 1242B. The carrier substrate 126B is located below the light-emitting stack layer 122 and surrounds the contact electrodes 1241B, 1242B. In an embodiment, the growth substrate for epitaxial growing the light-emitting stack 122 is partially or completely removed, thus the carrier substrate 126B is not a growth substrate. Moreover, the wavelength conversion layer 128B is located above the light-emitting stack 122. In an embodiment, the wavelength conversion layer 128B also covers a portion of the surface of the carrier substrate 126B.

In an embodiment, in the light-emitting unit 120B, the contact electrodes 1241B and 1242B are in the shape of pillar. The material of the carrier substrate 126B can be resin, such as epoxy resin. In an embodiment, the wavelength conversion layer 128B includes a binder (not shown, a first binder) and a plurality of wavelength conversion particles (not shown) dispersed in the binder, wherein the wavelength conversion particles can absorb the first light emitted from the light-emitting stack 122 and partially or totally convert the first light into a second light having the wavelength or spectrum different from the first light. In an embodiment, the wavelength conversion particles absorb the first light, such as blue or UV light, and then convert the first light to the second light (green light) having a dominant or peak wavelength between 510 nm and 560 nm. In another embodiment, the wavelength conversion particles absorb the first light, such as blue or UV light, and then convert the first light to the second light (red light) having a dominant or peak wavelength between 600 nm and 660 nm. The material of the wavelength conversion particles can comprise inorganic phosphor, organic fluorescent colorant, semiconductor, or a combination of the above-mentioned materials. The material of semiconductor comprises nano crystal semiconductor material, such as quantum-dot luminescent material.

Referring to FIG. 2C, the light-emitting unit 120C includes a light-emitting stack 122, contact electrodes 1241C and 1242C, a light-blocking fence 125C, a carrier substrate 126C, and a wavelength conversion layer 128C. In an embodiment, the light-emitting stack 122 is electrically connected to the contact electrodes 1241C and 1242C. The carrier substrate 126C is located above the light-emitting stack 122. The wavelength conversion layer 128C is located above the carrier substrate 126C. The light-blocking fence 125C surrounds the light-emitting stack 122, carrier substrate 126C and the wavelength conversion layer 128C. The light-blocking fence 125C can prevent the first light emitted by the light-emitting stack 122 and/or the second light emitted by the wavelength conversion layer 128C being emitted from the sides of the light-emitting unit 120C that may cause crosstalk between the neighboring light-emitting units.

The light-blocking fence 125C can include a binder (not shown, a second binder) and a plurality of light-absorbing particles or light-reflecting particles dispersed in the binder. The material of the light-absorbing particles can be carbon black. The material of the light-reflecting particles can be titanium oxide, zinc oxide, aluminum oxide, barium sulfate, or calcium carbonate.

Figure 3A:
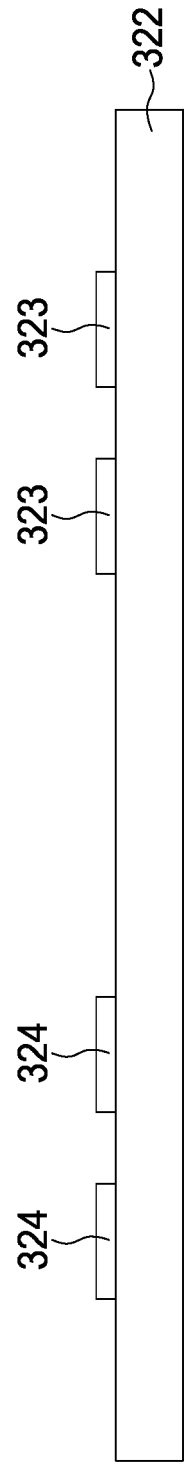
FIGS. 3A to 3E show the diagrams of manufacturing process of a light-emitting device in accordance with an embodiment of the present disclosure.

FIGS. 3A to 3E show the diagrams of manufacturing process of a light-emitting device 300A in accordance with an embodiment of the present disclosure. Referring to FIG. 3A, a carrier is provided. The carrier includes an insulating layer 322 (also referred as a second insulating layer) and a plurality of electrically conductive regions 323, 324. In an embodiment, the electrically conductive regions 323, 324 are formed on the insulating layer 322. In one embodiment, each of the electrically conductive regions 323, 324 has a pair of electrically conductive pads respectively correspond to the contact electrodes 1241, 1242 of the light-emitting unit 120. In addition, the electrically conductive regions 323, 324 may be electrically separated or electrically connected to each other.

The material of the insulating layer 322 may be epoxy resin, BT (Bismaleimide Triazine) resin, polyimide resin, composite material of epoxy resin and glass fiber, or composite material of BT resin and glass fiber. The material of the electrically conductive regions 323, 324 can be metal such as copper, tin, aluminum, silver, or gold. In an embodiment, when the light-emitting device 300A is used as a pixel in a display device, a light-absorbing layer (not shown) can be formed on the surface of the insulating layer 322 to increase the contrast, for example, a black coating.

Figure 3B:
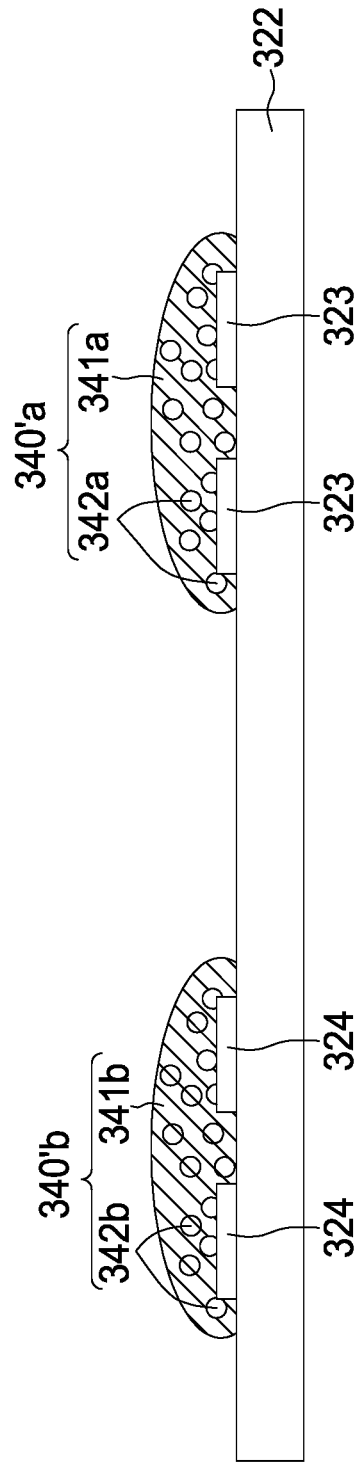

Referring to FIG. 3B, the glues containing the resins 341a, 341b and the electrically conductive particles 342a, 342b are respectively formed on and around the electrically conductive regions 323, 324. In an embodiment, the way for forming the glues is by a patterned fixture, wherein the patterned fixture is, for example, a stencil or a screen.

In an embodiment, the plurality of electrically conductive particles 342a is dispersed in the resin 341a. It is understood that the plurality of electrically conductive particles 342b is dispersed in the resin 341b. The materials of the resins 341a and 341b include a thermosetting polymer and a flux. The thermosetting polymer can be epoxy resin. The material of the electrically conductive particles 342a, 342b may be gold, silver, copper, or tin alloy. In an embodiment, the material of the electrically conductive particles may be metal having a low melting point or alloy having a low liquidus melting point. In an embodiment, the metal having a low melting point or the alloy having a low liquidus melting point has a melting point or liquidus temperature below 210° C. In another embodiment, the metal having a low melting point or the alloy having a low liquidus melting point has a melting point or liquidus temperature below 170° C. The material of the alloy having a low liquidus melting point may be tin indium alloy or tin antimony alloy.

Figure 3C:
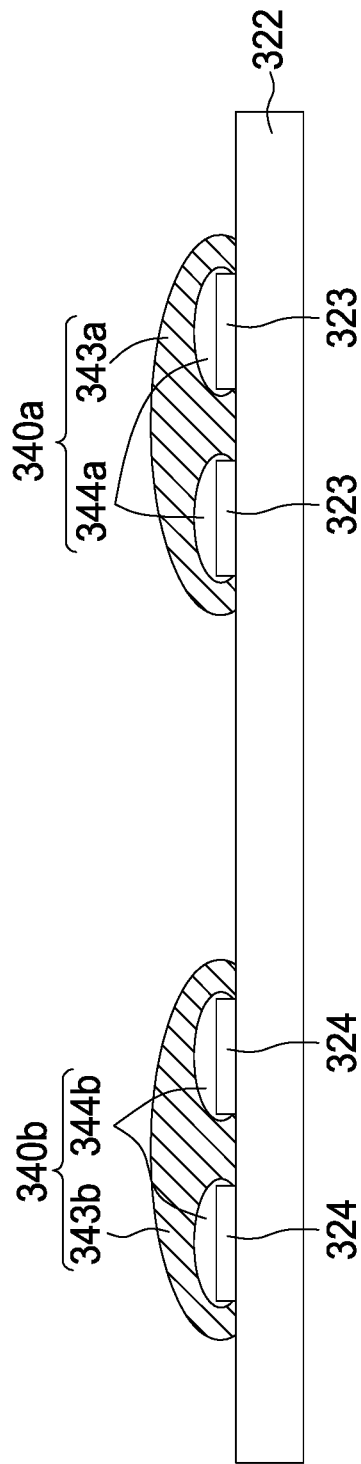

Referring to FIG. 3C, the resins 341a, 341b in the glues 340'a, 340'b are cured to form the protective portions 343a, 343b in the connection structures 340a, 340b. In this step, the electrically conductive particles 342a and 342b are melted to form lower portions 3442a and 3442b of the electrical connection portions in the connection structures 340a and 340b. The curing method can be heating. In an embodiment, during the curing phase, the adhesiveness of the resins 341a, 341b drops in the beginning and then rises so the electrically conductive particles 342a, 342b gather around the electrically conductive regions 323, 324. The electrically conductive particles 342a, 342b are gathered in the melting state. In an embodiment, the curing temperature is above 140° C.

Figure 3D:
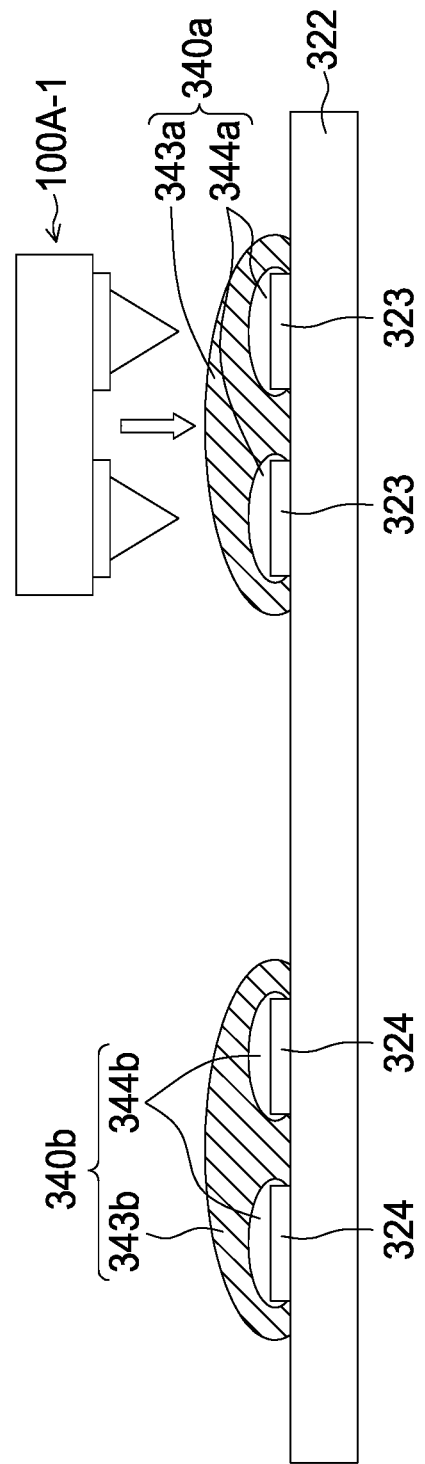

Referring to FIG. 3D, a light-emitting element 100A-1 is provided. In an embodiment, one light-emitting element 100A-1 corresponds to one electrically conductive region 323 and one connection structure 340a. In another embodiment, a plurality of light-emitting elements 100A-1, 100A-2 simultaneously correspond to the plurality of electrically conductive regions 323, 324 and the connection structures 340a, 340b.

Figure 3E:
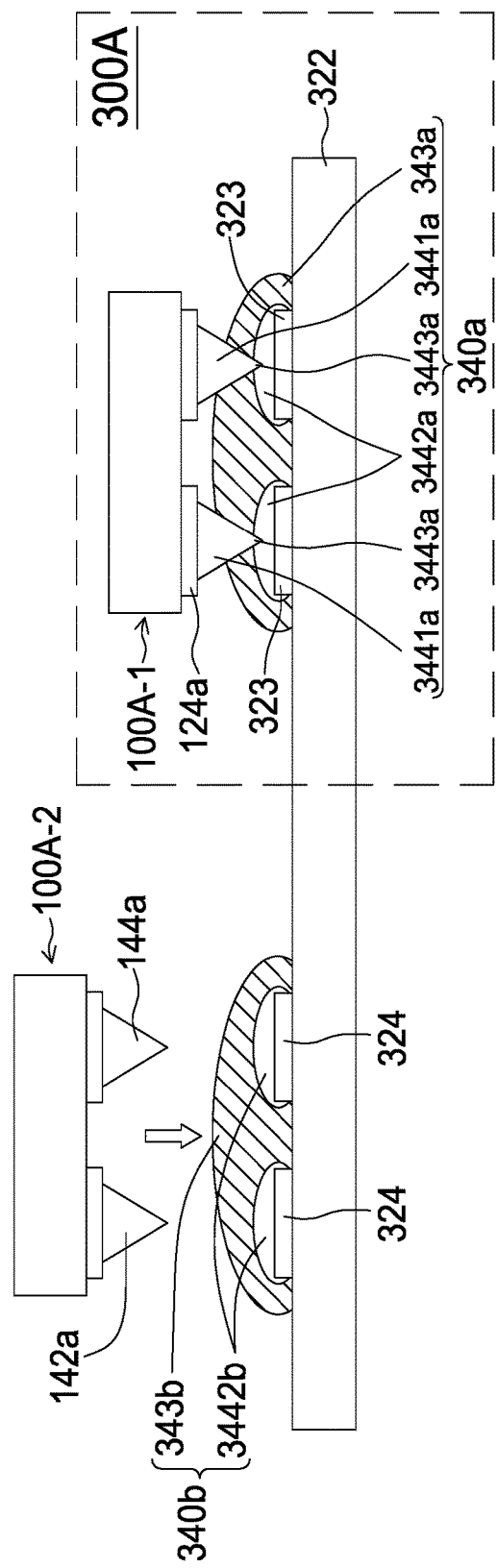

Referring to FIG. 3E, the bumps 142a, 144a of the light-emitting element 100A-1 are connected to the electrically conductive portion 323 through the lower portion 3442a of the electrical connection portion to constitute the light-emitting device 300A. In an embodiment, the bumps 142a, 144a of the light-emitting element 100A-1 are moved downward by an external force to penetrate the protective portion 343a until the lower portion 3442a of the electrical connection portion is in contact with the bumps 142a, 144a, which become the upper portion 3441a of the electrical connection portion in the connection structure 340a. In addition, a neck portion 3443a is formed between the upper portion 3441a of the electrical connection portion and the lower portion 3442a of the electrical connection portion. In an embodiment, the upper portion 3441a of the electrical connection portion is different from the lower portion 3442a of the electrical connection portion in terms of the material composition. For example, the upper portion 3441a of the electrical connection portion contains copper element and the lower portion 3442a of the electrical connection portion contains tin element. Similarly, the bumps 142a, 144a of the light-emitting element 100A-2 are connected to the electrically conductive region 324 by the lower portion 3442b of the electrical connection portion to constitute another light-emitting device. In an embodiment, the light-emitting element 100A-1 or the light-emitting element 100A-2 can be individually incorporated in a single light-emitting device 300A. In another embodiment, the light-emitting element 100A-1 and the light-emitting element 100A-2 can be incorporated together in a light-emitting device. In an embodiment, the insulating layer 322 can be cut in a subsequent step such that the light-emitting device 300A is physically separated from the other light-emitting device. In another embodiment, the insulating layer 322 does not need to be cut such that the light-emitting device 300A and the other light-emitting device share the insulating layer 322.

Figure 3F:
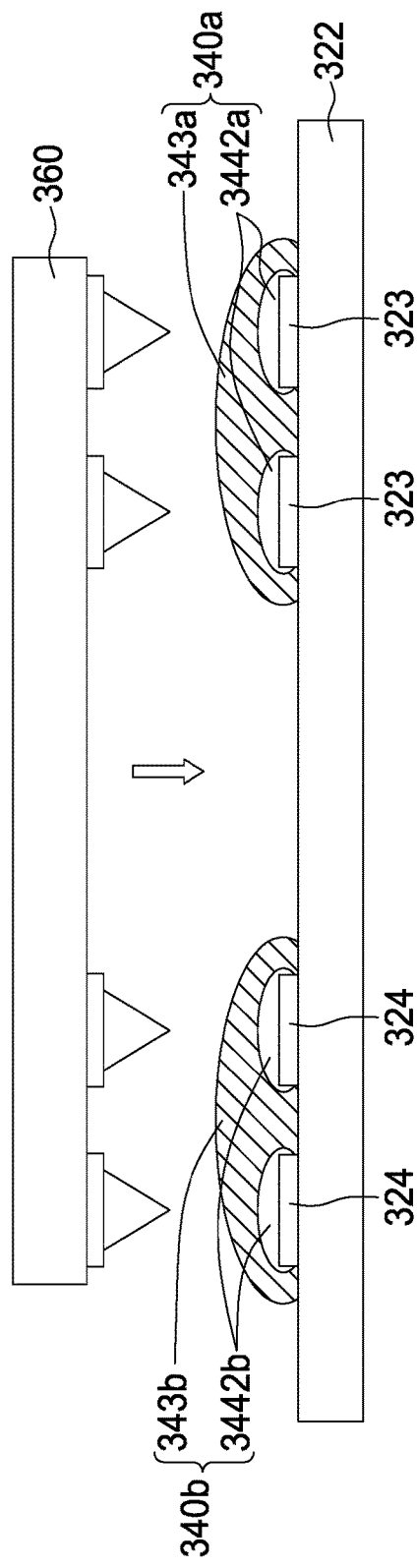
Figure 3G:
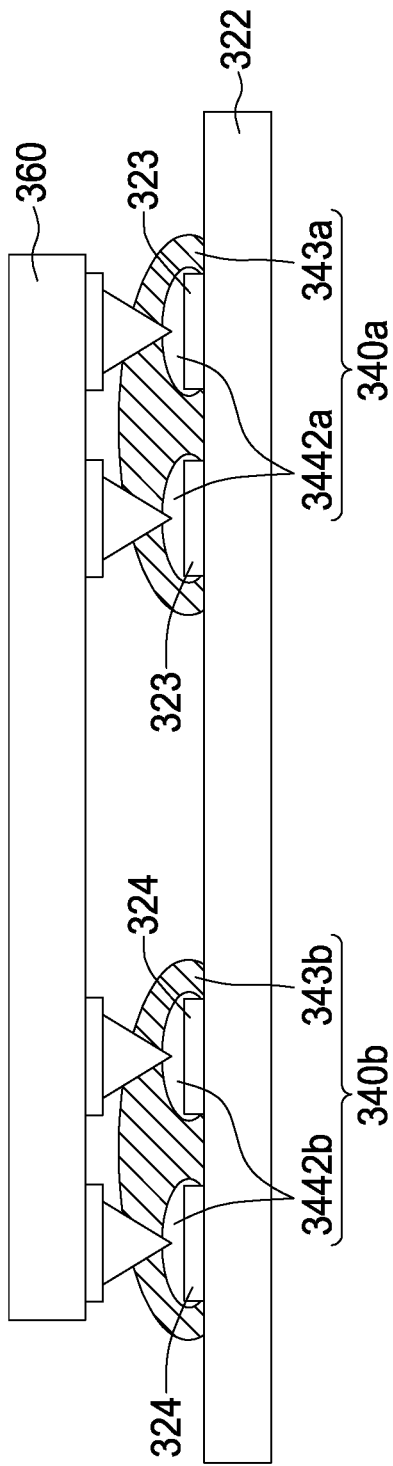
Figure 3H:
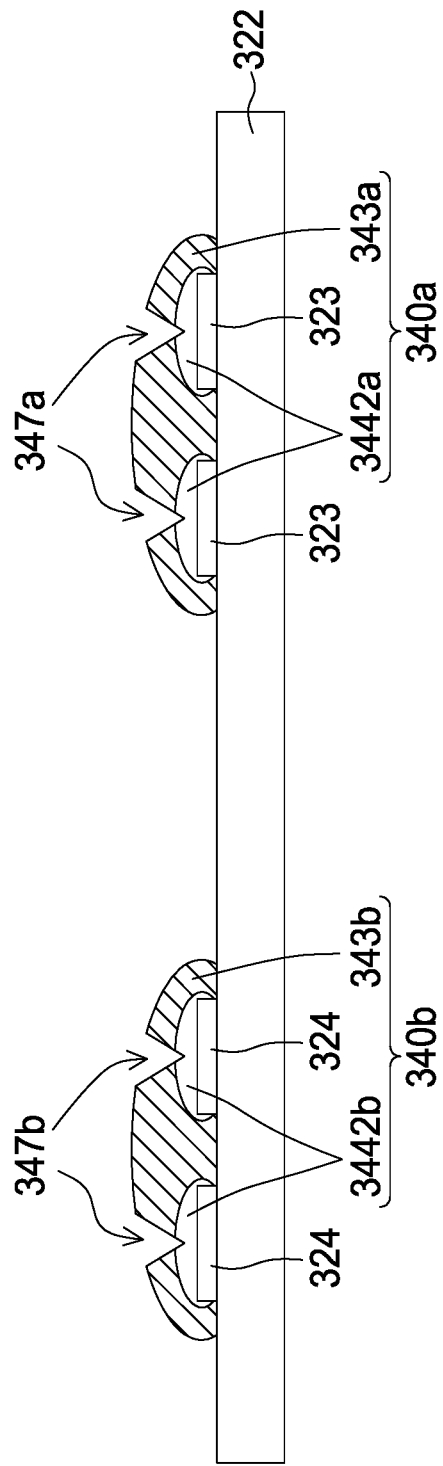
Figure 3I:
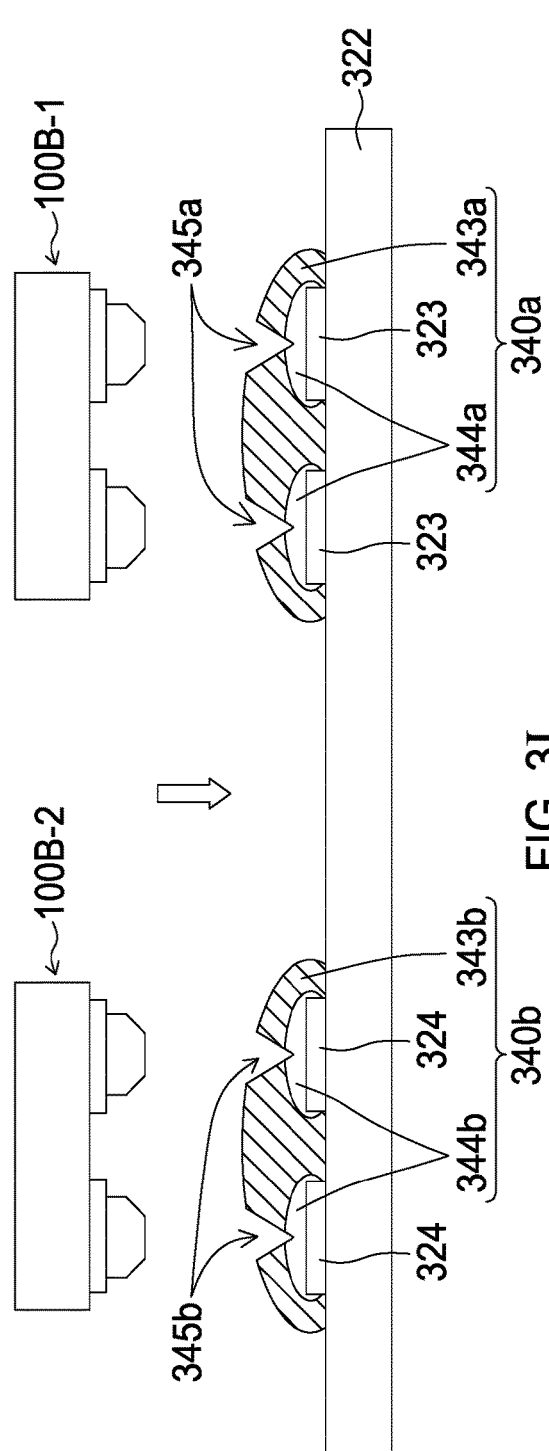
Figure 3J:
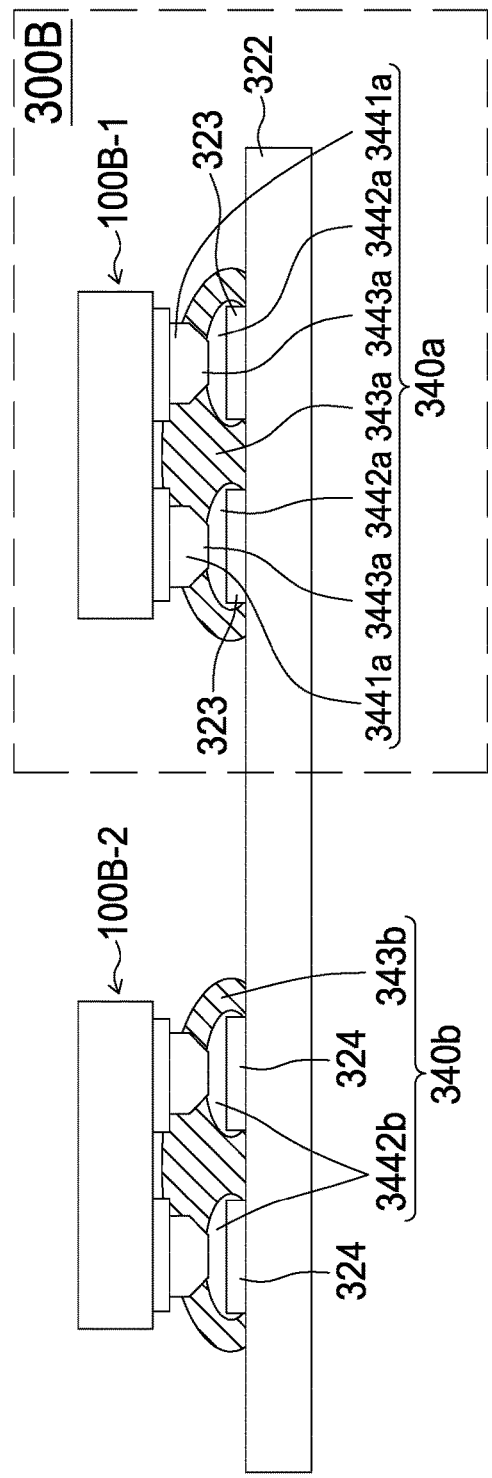

FIGS. 3A to 3C and 3F to 3J show the diagrams of manufacturing process of a light-emitting device 300B in accordance with another embodiment of the present disclosure. In FIG. 3C, after the steps of forming the protective portions 343a, 343b of the connection structures 340a, 340b and the lower portions 3442a, 3442b of the electrical connection portion, the following steps from FIGS. 3F to 3H show that a plurality of depressed portions 347a, 347b are formed in the connection structures 340a, 340b through a jig 360. In an embodiment, referring to FIG. 3F, a jig 360 having a plurality of convex portions 361 is provided. The shape of the convex portion is, for example, pointed. The respective convex portions 361 of the jig 360 are respectively aligned with the lower portions 3442a, 3442b of the electrical connection portions in the connection structures 340a, 340b. Referring to FIG. 3G, a plurality of convex portions in the jig 360 are inserted into the protective portion 343a until the lower portions 3442a, 3442b of the electrical connection portion are in contact with the convex portions. Referring to FIG. 3H, the jig 360 is upwardly separated from the connection structures 340a, 340b to form a plurality of depressed portions 347a, 347b. The plurality of depressed portions 347a, 347b respectively corresponds to the electrically conductive regions 323, 324 and the lower portions 3442a, 3442b of the electrical connection portion. Referring to FIG. 3I, the bumps 142b, 144b of the light-emitting elements 100B-1, 100B-2 are respectively aligned with the lower portion 3442a of the electrical connection portion and the electrically conductive region 323. Referring to FIG. 3J, the bumps 142b, 144b of the light-emitting element 100B-1 are electrically connected to the electrically conductive portion 323 through the lower portion 3442a of the electrical connection portion to constitute the light-emitting device 300B. Similarly, the bumps 142a and 144a of the light-emitting element 100B-2 are connected to the electrically conductive region 324 through the lower portion 3442b of the electrical connection portion to constitute another light-emitting device. In an embodiment, the light-emitting element 100B-1 and the light-emitting element 100B-2 can be incorporated together in a light-emitting device. In another embodiment, the light-emitting element 100B-1 or the light-emitting element 100B-2 can be individually incorporated in a single light-emitting device.

Figure 4A:
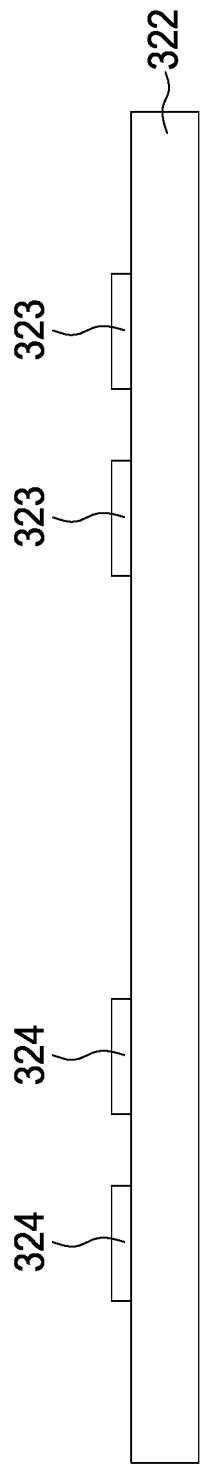
FIGS. 4A to 4E show the diagrams of manufacturing process of a light-emitting device in accordance with another embodiment of the present disclosure.

FIGS. 4A to 4E show the diagrams of manufacturing process of a light-emitting device 400A in accordance with another embodiment of the present disclosure. Referring to FIG. 4A, a carrier is provided. The carrier includes an insulating layer 322 and a plurality of electrically conductive regions 323, 324. The structure, function and material of the insulating layer 322 and the plurality of electrically conductive regions 323, 324 can be referred to the corresponding paragraphs of FIG. 3A.

Figure 4B:
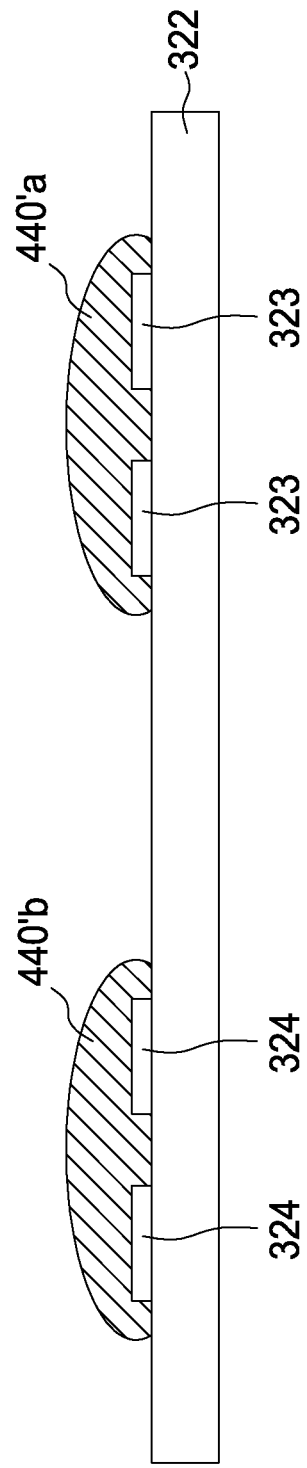

Referring to FIG. 4B, the glues 440'a, 440'b are respectively formed on and around the electrically conductive regions 323, 324. In an embodiment, the way for forming the glues 440'a, 440'b is by a patterned jig, wherein the patterned jig is, for example, a stencil or a screen. In an embodiment, the glues 440'a, 440'b contain resins. The material of the resins includes a thermosetting polymer and a flux. The thermosetting polymer can be epoxy resin. In another embodiment, the glues 440'a, 440'b comprises resins and light-reflecting particles dispersed in the resins. The material of the light-reflecting particles may be titanium oxide, zinc oxide, aluminum oxide, barium sulfate or calcium carbonate.

Figure 4C:
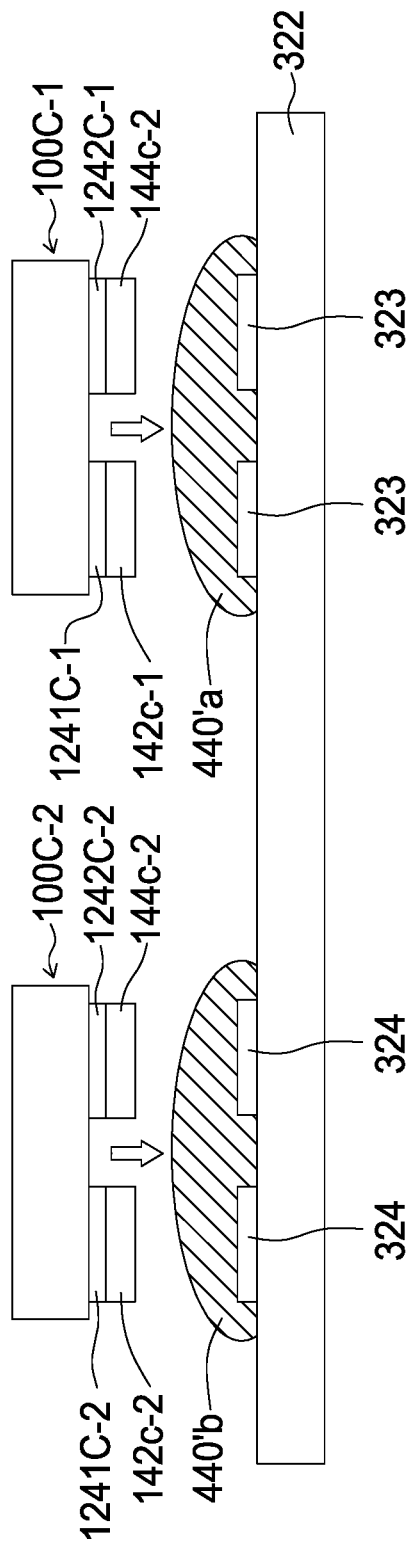
Figure 4D:
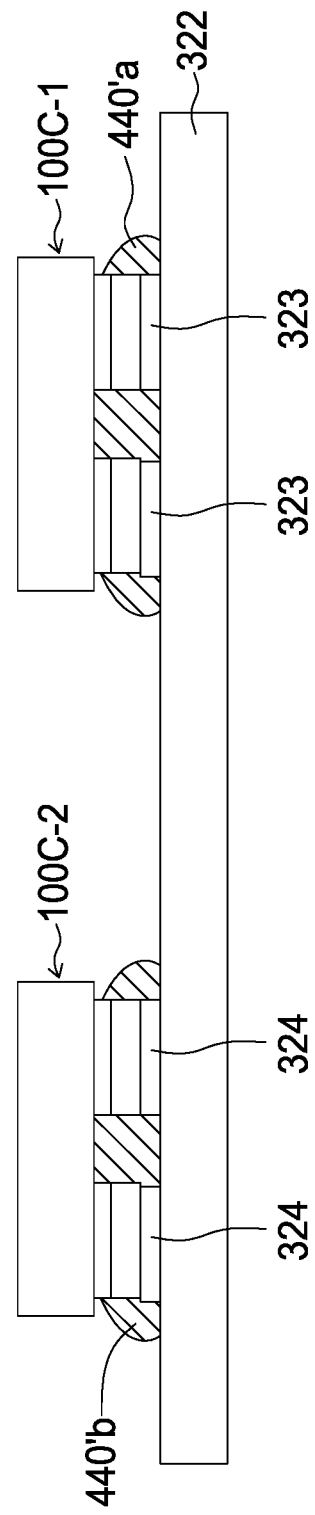

Referring to FIG. 4C, light-emitting elements 100C-1 and 100C-2 are provided. The bumps 142c-1, 144c-1 of the light-emitting element 100C-1 are aligned with the electrically conductive region 323 and the bumps 142c-2, 144c-2 of the light-emitting element 100C-2 are aligned with the electrically conductive region 324. Referring to FIG. 4D, the bumps 142c-1, 144c-1 of the light-emitting element 100C-1 penetrate through the glue 440'a and are in contact with the electrically conductive regions 323. Similarly, the bumps 142c-2, 144c-2 of the light-emitting element 100C-2 penetrate the glue 440'b and are in contact with the electrically conductive regions 324.

Figure 4E:
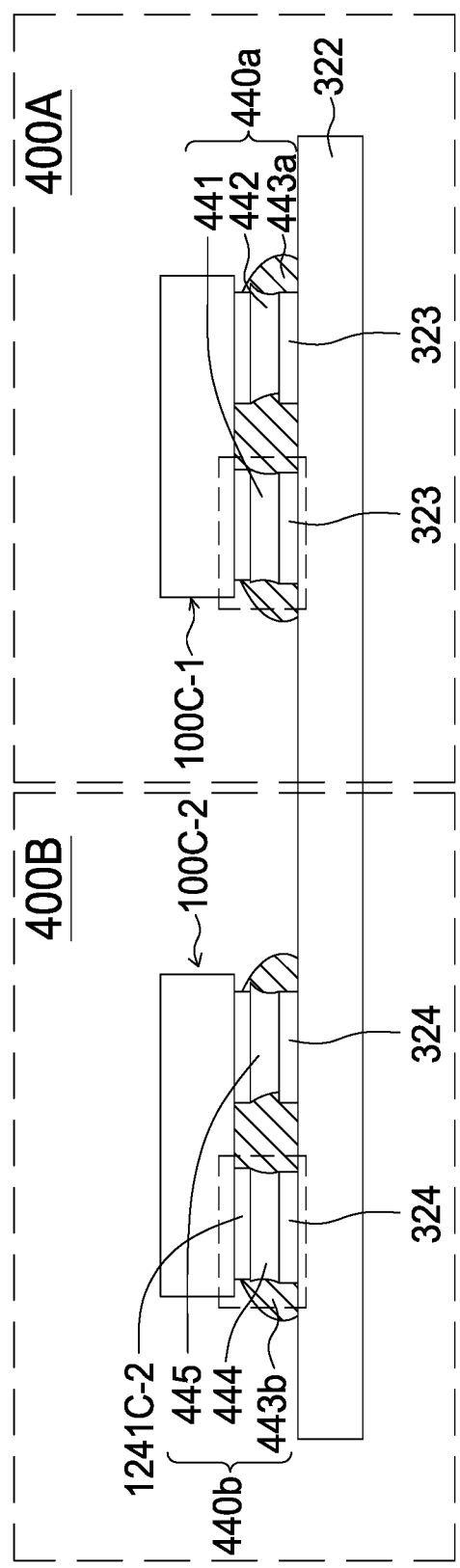

Referring to FIG. 4E, the bumps 142c-1, 144c-1, 142c-2, 144c-2 are melted. Therefore, the bumps 142c-1, 144c-1 are connected to the electrically conductive regions 323 to form the electrical connection portions 441, 442 in the connection structures 440a, 440b. Similarly, the bumps 142c-2, 144c-2 are connected to the electrically conductive regions 324 to form electrical connection portions 444, 445. In this step, in addition to melting the bumps 142c-1, 144c-1, 142c-2, 144c-2, the glues 440'a, 440'b are cured to form the protective portions 443a, 443b in the connection structures 440a, 440b. After melting the bumps 142c-1, 144c-1 of the light-emitting element 100C-1 and curing the glue 440'a, the light-emitting device 400A are formed. Similarly, after melting the bumps 142c-2, 144c-2 of the light-emitting element 100C-2 and curing the glue 440'a, another light-emitting device 400B are formed. In an embodiment, the connection structures 440a, 440b further include light-reflecting particles (not shown) dispersed in the protective portions 443a, 443b so the reflectance of the connection structures 440a, 440b for the light emitted from the light-emitting elements 100C-1, 100C-2 can be increased.

Figure 5B:
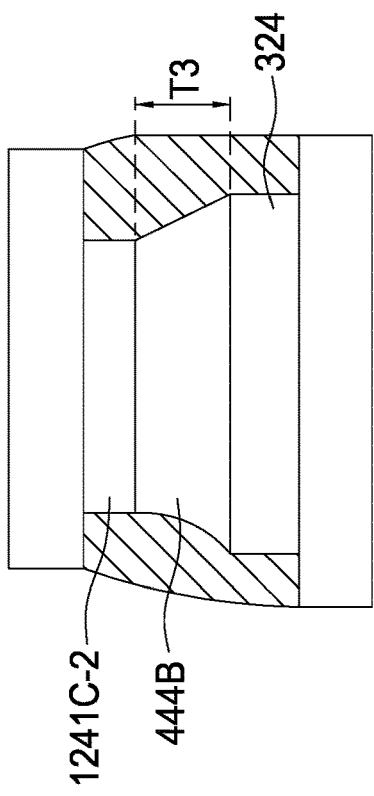
FIGS. 5A to 5D show the partial structural views of a light-emitting device in accordance with an embodiment of the present disclosure.
Figure 5D:
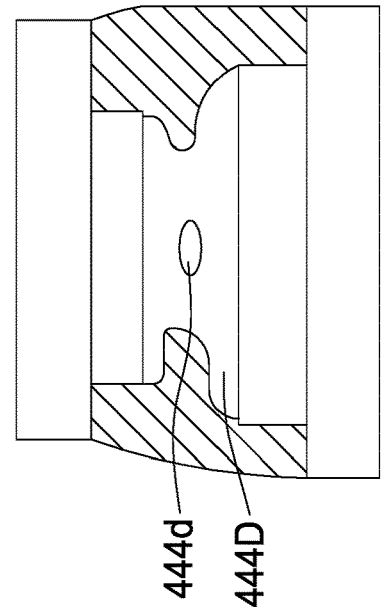
Figure 5A:
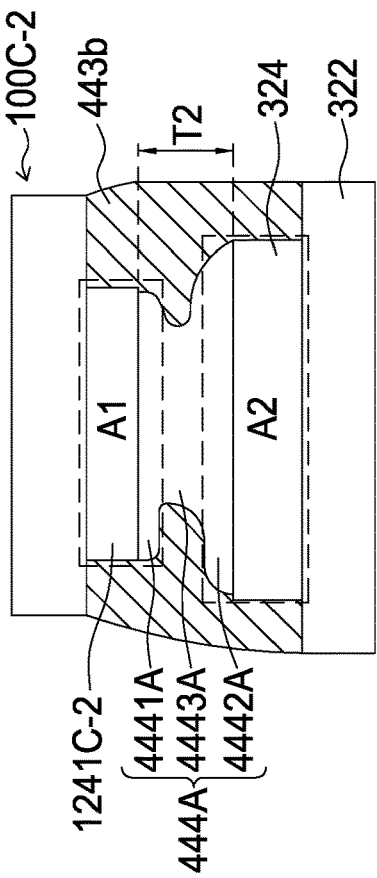

FIG. 5A shows a partial structural view of the connection structure 440b in the light-emitting device 400B. An electrical connection portion 444A is located between the contact electrode 1241C-2 of the light-emitting element 100C-2 and the electrically conductive region 324 on the insulating layer 322. In an embodiment, the electrical connection portion 444A includes an upper portion 4441A, a neck portion 4443A and a lower portion 4442A. The neck portion 4443A is located between the upper portion 4441A and the lower portion 4442A. In an embodiment, the upper portion 4441A of the electrical connection portion has the same material composition with the lower portion 4442A of the electrical connection portion, for example, both contain tin. In an embodiment, the width of the neck portion 4443A is less than the width of the upper portion 4441A. In an embodiment, the width of the upper portion 4441A is less than the width of the lower portion 4442A. In an embodiment, the electrical connection portion 444A has a thickness T2 less than 5 microns. In another embodiment, the electrical connection portion 444 has a thickness T2 greater than 3 microns. In another embodiment, the electrical connection portion 444 has a thickness T2 between 1 micron and 4 microns. In an embodiment, at least a portion of the bottom surface of the upper portion 4441A is substantially planar. In an embodiment, the distance between the bottom surfaces of the contact electrode 1241C-2 to the plane of the bottom surface of the upper portion 4441A is less than 1 micron. In another embodiment, the distance between the bottom surfaces of the contact electrode 1241C-2 to the plane of the bottom surface of the upper portion 4441A is less than 0.5 micron. In an embodiment, the protective portion 443a surrounds the electrical connection portion 444A. In an embodiment, the protective portion 443a covers the contact electrode 1241C-2, the electrical connection portion 444A and the electrically conductive region 324. The protective portion 443a can protect the contact electrode 1241C-2, the electrical connection portion 444A, and/or the electrically conductive region 324 so that the moisture or oxygen in the environment can be kept away from the contact electrode 1241C-2, the electrical connection portion 444A, and/or the electrically conductive region 324. In addition, the protective portion 443a can avoid the problem that the electrical connection portion 444A is short-circuited due to the connection portion 444A melted in high temperature environment.

Referring to FIG. 5A, in an embodiment, all the upper portion 4441A, the neck portion 4443A and the lower portion 4442A contain gold element. In an embodiment, the upper portion 4441A, the neck portion 4443A and the lower portion 4442A contain gold element and tin element. In an embodiment, the content of the gold element in the area A1 of the contact electrode 1241C-2 and the upper portion 4441A is greater than that in the area A2 of the electrically conductive region 324 and the lower portion 4442A. That means the atomic percentage of the gold element in the area A1 of the contact electrode 1241C-2 and the upper portion 4441A is larger than the atomic percentage of the gold element in the area A2 of the lower portion 4442A. The above-mentioned elements can be analyzed by Energy-dispersive X-ray spectroscopy (EDX).

FIG. 5B shows a partial structural view of the connection structure 440b in the light-emitting device 400B. Different from FIG. 5A, the electrical connection portion 444B of the connection structure 440b has no neck portion. In an embodiment, the width of the electrical connection portion 444B is gradually widened from the contact electrode 1241C-2 toward the electrically conductive region 324. In an embodiment, the thickness T2 of the electrical connection portion 444 is less than 3 microns. The thickness T3 of the electrical connection portion 444 is between 1 micron and 3 microns.

Figure 5C:
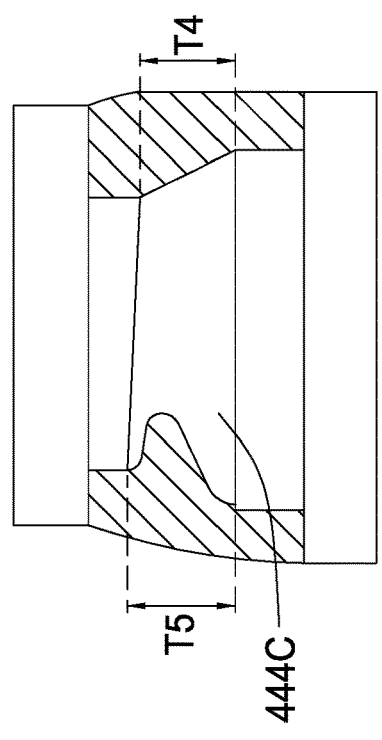

FIG. 5C shows a partial structural view of the connection structure 440b in the light-emitting device 400B. Being different from FIG. 5A, each of the two edges of the electrical connection portion 444C respectively has thickness T4 and T5, and the thickness T4 and T5 are different. Besides, the thickness T4 is smaller than the thickness T5. The shape of thickness T5 is similar to that of FIG. 5A and has a neck portion. The shape of thickness T4 is similar to that of FIG. 5B and does not have neck portion.

FIG. 5D shows a partial structural view of the connection structure 440b in the light-emitting device 400B. There is a hole 444d in the electrical connection portion 444D. The electrical connection portion 444D can include a single hole or multiple holes 444d. The shape of the hole 444d may be regular or irregular. Regular shape can be round, oval or polygonal.

Figure 6:
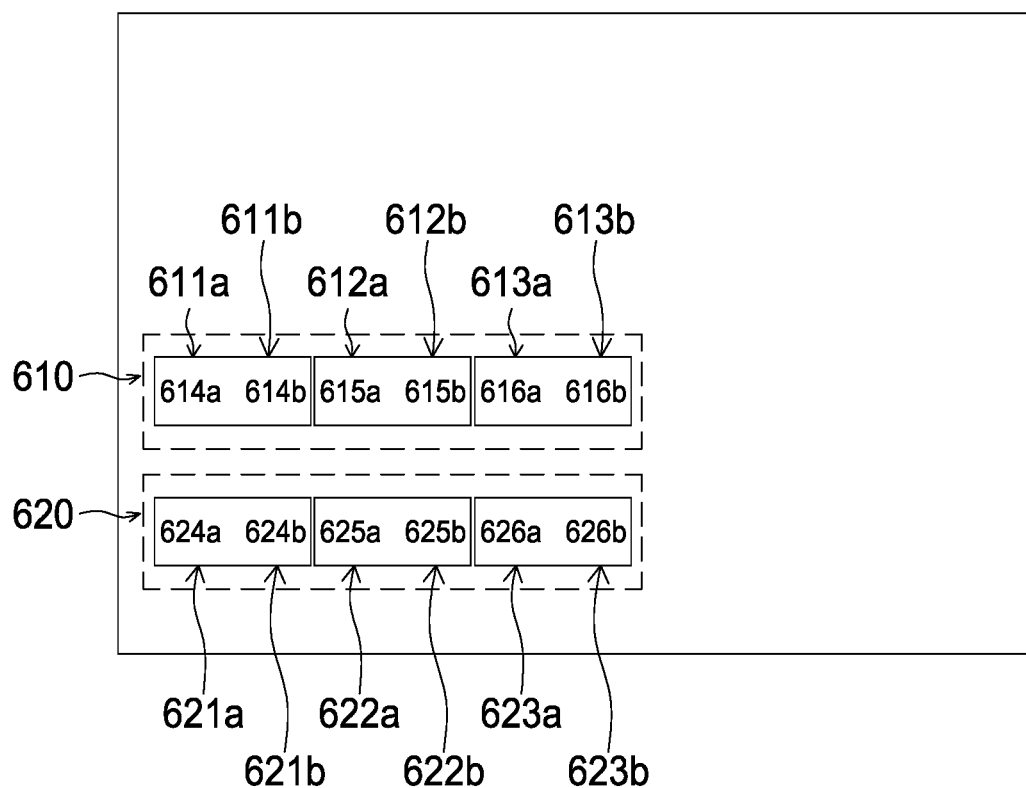
FIG. 6 shows a top view of a light-emitting module in accordance with an embodiment of the present disclosure.

FIG. 6 shows a top view of a light-emitting module 600 in accordance with an embodiment of the present disclosure. In an embodiment, the light-emitting module 600 includes a first pixel 610 and a second pixel 620. It can be understood that the number of pixels depends on the requirements of the light-emitting module 600, and only two pixels in the light-emitting module 600 are shown here. The first pixel 610 includes six sub-pixel blocks 611a, 611b, 612a, 612b, 613a, 613b. The sub-pixel blocks 611a, 611b, 612a, 612b, 613a, 613b can be individually provided for disposition of the light-emitting elements 614a, 614b, 615a, 615b, 616a, 616b. The structure of the light-emitting elements 614a, 614b, 615a, 615b, 616a, 616b may be the above-described light-emitting element 100A, light-emitting element 100B, light-emitting element 100C, or a combination thereof, or any suitable light-emitting element. The sub-pixel block 611a and the sub-pixel block 611b are first group. The sub-pixel block 612a and the sub-pixel block 612b are second group. The sub-pixel block 612a and the sub-pixel block 612b are third group. One group having two sub-pixel blocks provides a backup function. When a sub-pixel block fails to operate during testing or the performance cannot meet the requirements, such as insufficient brightness or color point shift, another sub-pixel block can be provided to another light-emitting element during the subsequent repair step. Therefore, not all of the sub-pixel blocks 611a, 611b, 612a, 612b, 613a, and 613b have the light-emitting elements 614a, 614b, 615a, 615b, 616a, and 616b. In one embodiment, only the light-emitting elements 614a, 615a, 616a are respectively placed in the sub-pixel blocks 611a, 612a, 613a in the beginning. When the test results of the light-emitting elements 614a, 615a, 616a are all normal, the light-emitting elements 614b, 615b, 616b are no longer placed in the sub-pixel blocks 611b, 612b, 613b. If the light-emitting element 614a is abnormal, the light-emitting element 614a will not be turned on, and replaced by the light-emitting element 614b. The mechanism for light-emitting elements 615a, 616a is also similar to the condition of the light-emitting element 614a. Similarly, the second pixel 620 includes six sub-pixel blocks 621a, 621b, 622a, 622b, 623a, 623b. The sub-pixel blocks 621a, 621b, 622a, 622b, 623a, 623b can be individually provided for disposition of the light-emitting elements 624a, 624b, 625a, 625b, 626a, 626b. The sub-pixel block in the second pixel 620 and the light-emitting element have substantially the same function with the first pixel 610.

Figure 7C:
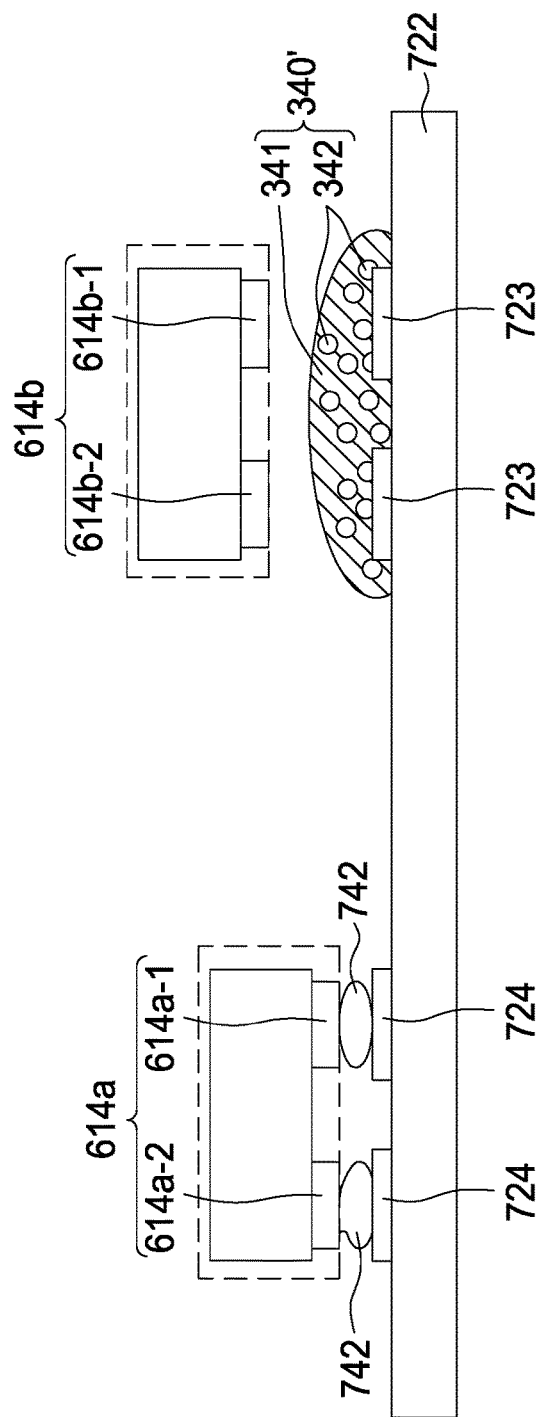

FIGS. 7A to 7D show the diagrams of a manufacturing process for repairing a light-emitting module in accordance with an embodiment of the present disclosure. Referring to FIG. 7A, a carrier is provided. The carrier includes an insulating layer 722 (a second insulating layer) and a plurality of electrically conductive regions 723, 724. The structure, function and material of the insulating layer 722 and the plurality of electrically conductive regions 723, 724 can be referred to the corresponding paragraphs of FIG. 3A. A light-emitting element 614a is formed on the electrically conductive regions 724 of the carrier. In an embodiment, the light-emitting element 614a is electrically connected to the electrically conductive regions 724, and is electrically connected through solder 742. In other embodiments, the manufacturing process of the electrical connection between the light-emitting element 614a and the electrically conductive regions 724 can be any of the above-mentioned paragraphs of FIGS. 3A to 4E. At this time, the electrically conductive regions 723 are exposed. After testing the light-emitting element 614a, the light-emitting element 614a is considered abnormal. Referring to FIG. 7B, a glue 340' containing resin 341 and electrically conductive particles 342 is formed on and around the electrically conductive regions 723. The structure, function and material of the resin 341, the electrically conductive particles 342, and the glue 340' can be referred to the corresponding paragraphs of FIG. 3B.

Figure 7D:
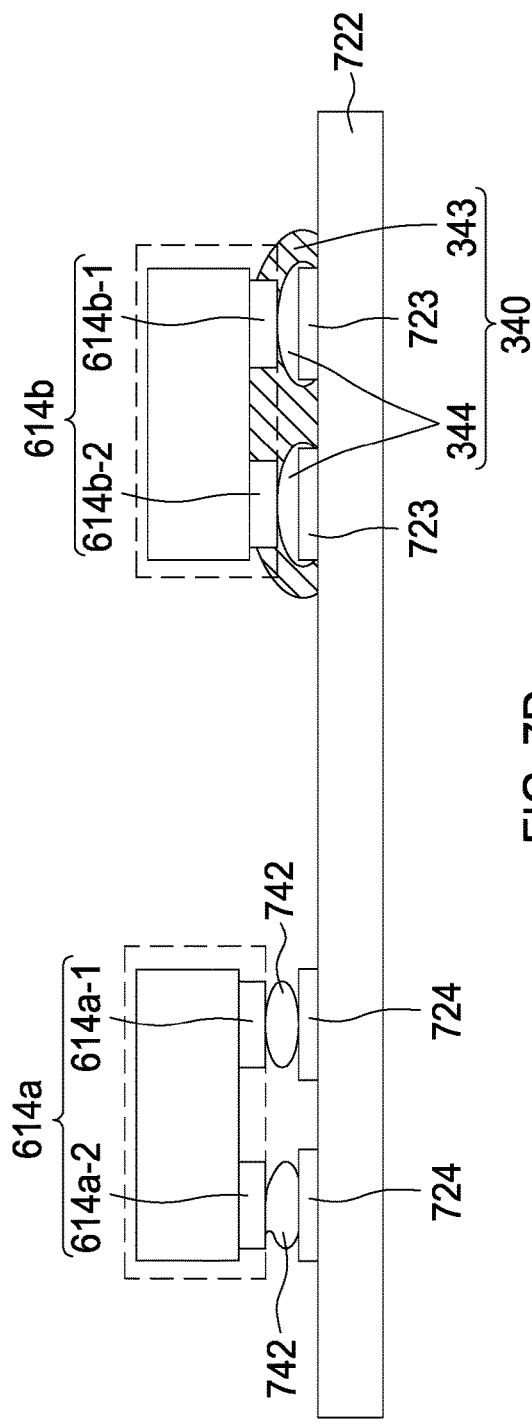

Referring to FIG. 7C, a light-emitting element 614b is provided and the electrodes 614b-1, 614b-2 of the light-emitting element 614b are aligned with the electrically conductive regions 723. The electrodes 614b-1, 614b-2 of the light-emitting element 614b may be metal pads, bumps, or any of the bumps of FIGS. 1A to 1C. Referring to FIG. 7D, the light-emitting element 614b is placed over the electrically conductive regions 723 and the electrically conductive particles 342 are melted to form a connection structure 340. In this step, the resin 341 in the glue 340' is cured to form the protective portion 343 in the connection structure 340. The description of the variation of the resin 341, the electrically conductive particles 342 and the glue 340' in this step can be referred to the corresponding paragraphs of FIG. 3C.

Figure 7E:
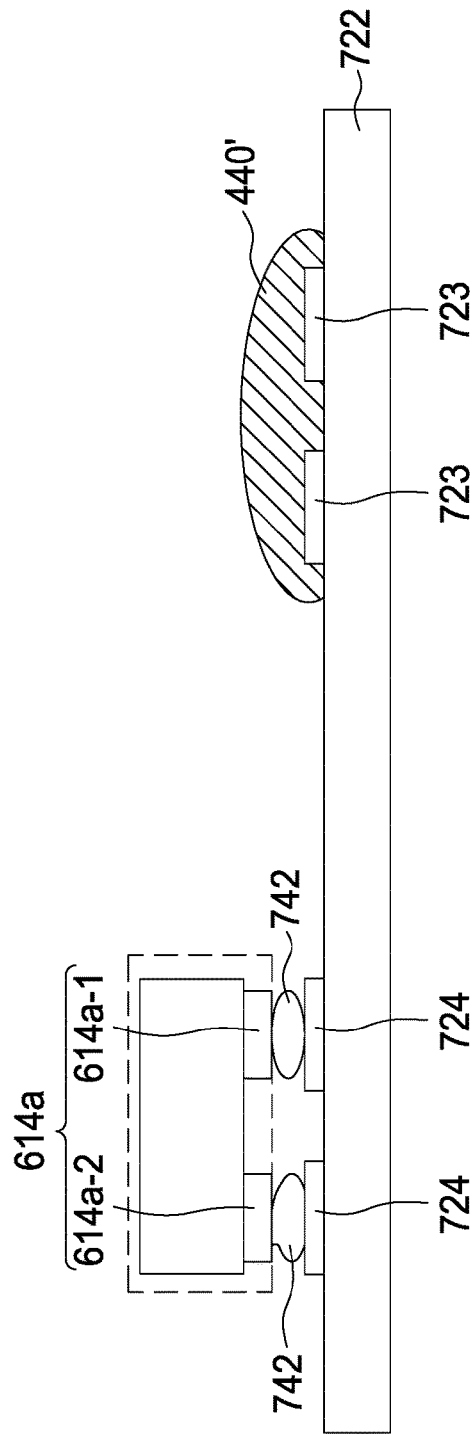

FIGS. 7A, and 7E to 7G show the diagrams of a manufacturing process of repairing a light-emitting module in accordance with another embodiment of the present disclosure. After the process disclosed in FIG. 7A, the next process is shown in FIG. 7E. the glue 440' is formed on and around the electrically conductive regions 723. The formation, function and material of the glue 440' can be referred to the corresponding paragraphs of FIG. 4B.

Figure 7F:
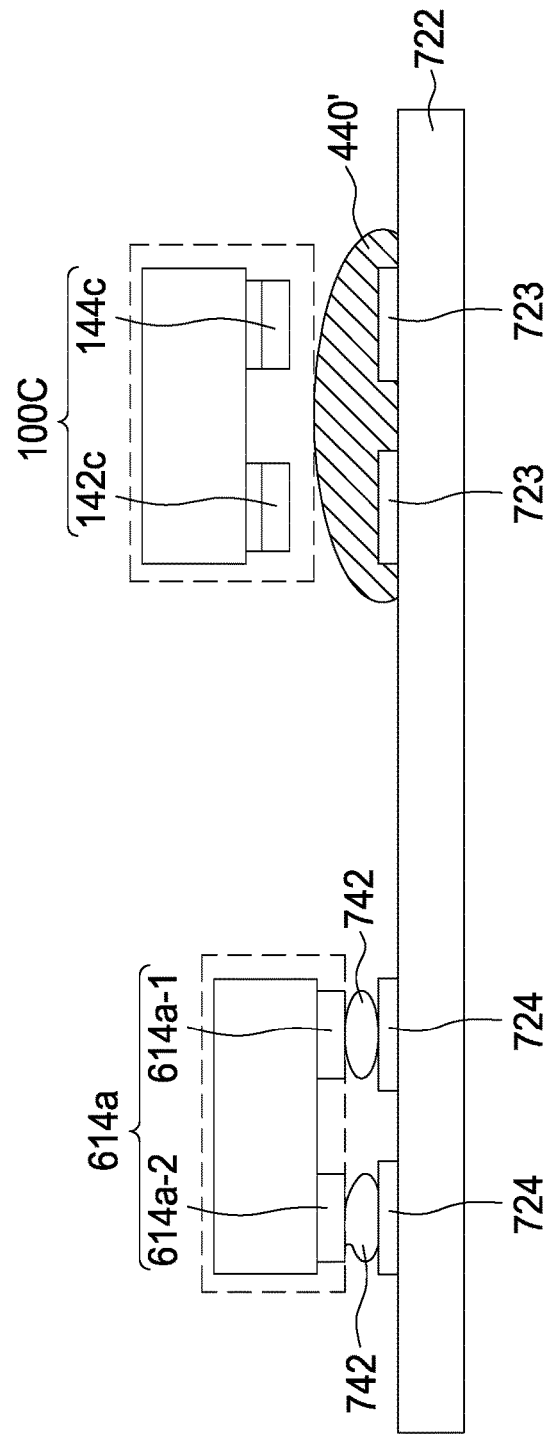
Figure 7G:
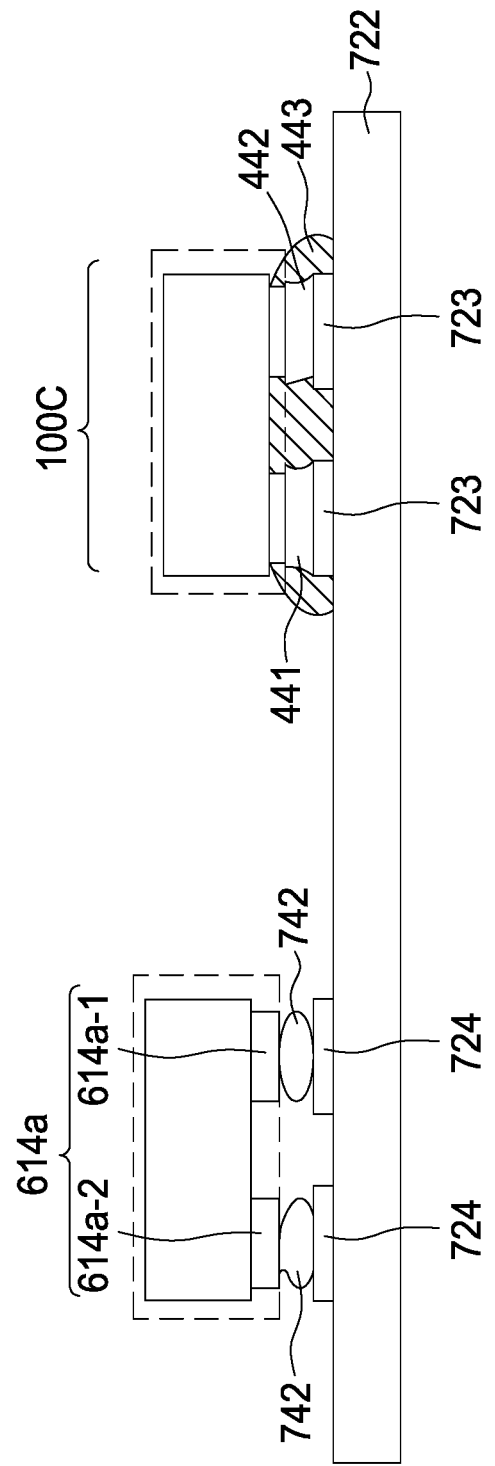

Referring to FIG. 7F, a light-emitting element 100C is provided and the bumps 142c, 144c of the light-emitting element 100C are aligned with the electrically conductive regions 723. The bumps 142c, 144c of the light-emitting element 100C can be referred to the corresponding paragraphs of FIG. 1C. Referring to FIG. 7G, the bumps 142c, 144c are melted. Therefore, the bumps 142c, 144c are connected to the electrically conductive regions 723 to form the electrical connection portions 441, 442 in the connection structure 440. In this step, in addition to melting the bumps 142c, 144c, the glue 440' is cured to form the protective portion 443 in the connection structure 440.

FIGS. 8A to 8G show the diagrams of a manufacturing process of transferring a plurality of light-emitting elements to a target substrate in accordance with an embodiment of the present disclosure. Referring to FIG. 8A, a transfer device is provided. In an embodiment, the transfer device includes an imprint head 820 and the imprint head 820 includes a plurality of pillars 822. In an embodiment, the plurality of pillars 822 is spaced apart from each other by the same distance. In another embodiment, the plurality of pillars 822 can be spaced apart from each other by a different distance. Besides, adhesive 810' is disposed at each bottom of the plurality of pillars 822. In an embodiment, the material of the adhesive 810' is a thermal release material. The characteristic of the thermal release material is that the adhesiveness of the material is changed after being heated. In an embodiment, the thermal release material is a thermal release tape that the adhesiveness is reduced after being heated. Reduced adhesiveness means that the adhesive strength after being heated is less than one-twentieth of that before being heated.

Referring to FIG. 8B, an original substrate 830 is provided and the original substrate 830 includes a plurality of light-emitting elements 860. The original substrate 830 can be used as a carrier for the light-emitting element 860. In an embodiment, the material of the original substrate 830 may be plastic, glass or sapphire. In an embodiment, the light-emitting element 860 comprises a semiconductor material. The structure of the plurality of light-emitting elements 860 may be the above-mentioned light-emitting element 100A, light-emitting element 100B, light-emitting element 100C, or a combination thereof, or any suitable light-emitting element. The plurality of light-emitting elements 860 comprises two groups, one group being the selected light-emitting elements 862 and the other group being the unselected light-emitting elements 864. In an embodiment, the selected light-emitting elements 862 are interspersed with the unselected light-emitting elements 864. The number of interspersion can be adjusted as needed, for example: 1, 2 or 3. The number of interspersion can be fixed or varied. A plurality of pillars 822 correspond to the selected light-emitting elements 862. In an embodiment, the adhesive 810' contacts the selected light-emitting elements 862.

Referring to FIG. 8C, the selected light-emitting elements 862 are separated from the original substrate 830. In an embodiment, the bonding force of the adhesive 810' through the plurality of pillars 822 is greater than the bonding force between the selected light-emitting elements 862 and the original substrate 830, such that the plurality of pillars 822 can grab up the selected light-emitting elements 862.

Referring to FIG. 8D, a target substrate 850 is provided. The upper surface of the target substrate 850 has a plurality of conductive pads 852. A glue (or referred as self-assembly glue) 840' is formed on and around the conductive pads 852. The selected light-emitting elements 862 on the imprint head 820 are corresponded to the conductive pad 852. The target substrate 850 can be a circuit substrate. The structure, function and material of the glue (or referred as self-assembly glue) 840' can be referred to the corresponding paragraphs of FIGS. 3B and 7B.

Referring to FIG. 8E, the selected light-emitting elements 862 are in contact with the glue 840' on the conductive pads 852. In an embodiment, the light-emitting elements 862 are forced downward such that a contact electrode (not shown) on the light-emitting elements 862 are in contact with or in close proximity to the conductive pads 852. At this time, a portion of the bottom of the light-emitting element 862 is covered by the glue 840'.

Referring to FIG. 8F, the selected light-emitting elements 862 are placed over the conductive pads 852 and then an energy E1 is provided to melt the electrically conductive particles (not shown) in the glue 840' and to cure the resin (not shown) in the glue 840' to form a cured glue layer (or referred as connection structure) 840. The related description of the resin, electrically conductive particles, and glue 840' of this step can be referred to the corresponding paragraphs of FIG. 3C. In an embodiment, the energy E1 is provided by a thermal energy, the electrically conductive particles are melted and the resin is cured by heating, and the adhesiveness of the adhesive 810' is lowered to form the adhesive 810. As such, the bonding force of the cured adhesive layer (or referred as connection structure) 840 to the light-emitting elements 862 is greater than that to the adhesive 810.

Referring to FIG. 8G, the selected light-emitting elements 862 are formed on the target substrate 850 and separated from the transfer device. Since the bonding force of the cured adhesive layer 840 to the light-emitting elements 862 is greater than the bonding force of the adhesive 810 to the light-emitting elements 862 in the previous step, when the imprint head 820 of the transfer device moves upward, the selected light-emitting elements 862 can be fixed on the target substrate 850 and separated from the imprint head 820 of the transfer device. In this step, the light-emitting elements 862 are also electrically connected to the conductive pads 852 of the target substrate 850.

FIGS. 9A to 9B show the diagrams of a manufacturing process of transferring a plurality of light-emitting elements to a target substrate in accordance with another embodiment of the present disclosure. The steps before the FIG. 9A can be referred to the corresponding paragraphs of FIGS. 8A to 8E. In this embodiment, the adhesive 810' is a photodissociation material. The characteristic of a photodissociation material or a photocurable material is that the adhesiveness of the material is changed after being illuminated. In an embodiment, the photodissociation material is a UV release tape that the adhesiveness is reduced after exposure to ultraviolet light. Referring to FIG. 9A, the selected light-emitting elements 862 are placed over the conductive pads 852 and provides energy E1 to melt the electrically conductive particles (not shown) in the glue 840' and to cure the resin in the glue 840'. A cured adhesive layer (or referred as connection structure) 840 is formed after the curing. In addition, energy E2 is provided to the adhesive 810' to convert the adhesive 810' into a lower adhesiveness adhesive 810. In an embodiment, the energy E1 is provided by a thermal energy, the energy E2 is provided by ultraviolet light, and the adhesive 810' is an UV release tape. The description of the variation of the glue 840' at this step can be referred to the corresponding paragraphs of FIG. 3C.

Referring to FIG. 9B, the selected light-emitting elements 862 are formed on the target substrate 850 and separated from the transfer device. This step can be referred to the corresponding paragraphs of FIG. 8G.

FIGS. 10A to 10B show the diagrams of a manufacturing process of transferring a plurality of light-emitting elements to a target substrate in accordance with another embodiment of the present disclosure. The steps before the FIG. 10A can be referred to the corresponding paragraphs of FIGS. 8A to 8E. In this embodiment, the adhesive 810' is a thermal release material and solder is formed on the conductive pads 852. In an embodiment, solder having eutectic property is formed on the conductive pads 852. Referring to FIG. 10A, the selected light-emitting elements 862 are placed over the conductive pads 852 and energy E1 is provided to melt the solder to form the connection structures 1040. In addition, energy E3 is simultaneously provided such that the light-emitting elements 862 can be in close contact with the conductive pads 852. In an embodiment, the energy E1 is provided by a thermal energy and the energy E3 is provided by a pressure.

Referring to FIG. 10B, after the connection structures 1040 are formed under the selected light-emitting elements 862, the selected light-emitting elements 862 are formed on the target substrate 850 and separated from the transfer device. This step can be referred to the corresponding paragraphs of FIG. 8G.

FIGS. 11A to 11B show the diagrams of a manufacturing process of transferring a plurality of light-emitting elements to a target substrate in accordance with another embodiment of the present disclosure. The steps before the FIG. 11A can be referred to the corresponding paragraphs of FIGS. 8A to 8E. In this embodiment, the adhesive 810' is a thermal release material and the glue 1140' formed on the conductive pads 852 is Anisotropic Conductive Paste (ACP). Referring to FIG. 11A, the selected light-emitting elements 862 are placed over the conductive pads 852 and energy E1 is provided to cure the resin (not shown) in the glue 1140' to form a cured adhesive layer (or referred as connection structure) 1140. In addition, energy E3 is simultaneously provided so that the light-emitting element 862 and the conductive pad 852 can be closely adjacent to each other, and the light-emitting element 862 and the conductive pad 852 are electrically connected through the electrically conductive particles in the glue 1140'. In an embodiment, the energy E1 is provided by a thermal energy and the energy E3 is provided by a pressure.

Referring to FIG. 11B, after the connection structures 1140 are formed under the selected light-emitting elements 862, the selected light-emitting elements 862 are formed on the target substrate 850 and separated from the transfer device. This step can be referred to the corresponding paragraphs of FIG. 8G.

Figure 12:
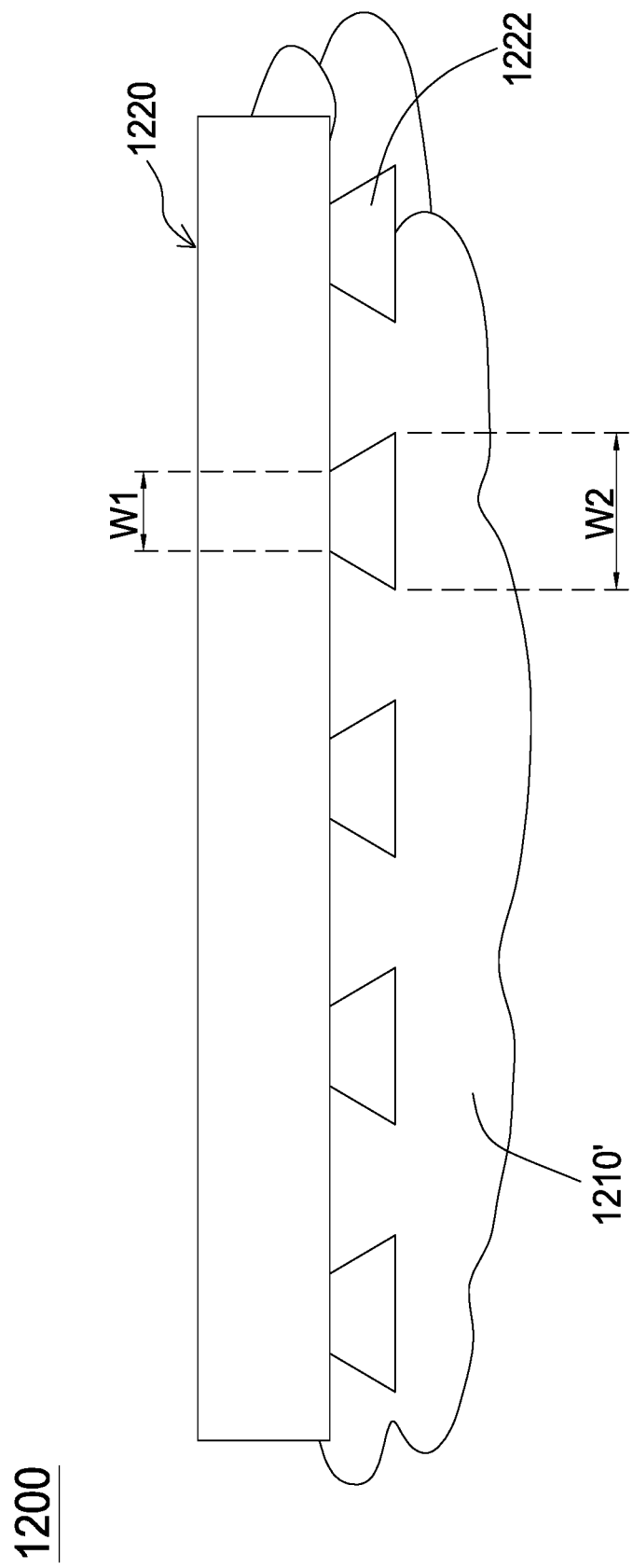
FIG. 12 shows a transfer device in accordance with an embodiment of the present disclosure.

FIG. 12 shows an imprint head 1220 of a transfer device 1200 in accordance with an embodiment of the present disclosure. The imprint head 1220 in the transfer device 1200 has a plurality of pillars 1222. The structure of the pillar 1222 is viewed from a cross-sectional view. The width of the bottom of the pillar 1222 is greater than the width of the upper portion of the pillar 1222. A groove is formed between the pillars 1222, and the width of the groove is gradually narrowed from the inside to the outside, so that when a part of the adhesive 1210' is filled into the groove, the grabbing force of the transfer device 1200 to the adhesive 1210' can be increased to avoid the adhesive 1210' falling from the transfer device 1200. The transfer device 1200 can be used in any of the above-mentioned embodiments in FIGS. 8A to 11B or any embodiment suitable for transferring light-emitting elements.

Figure 13A:
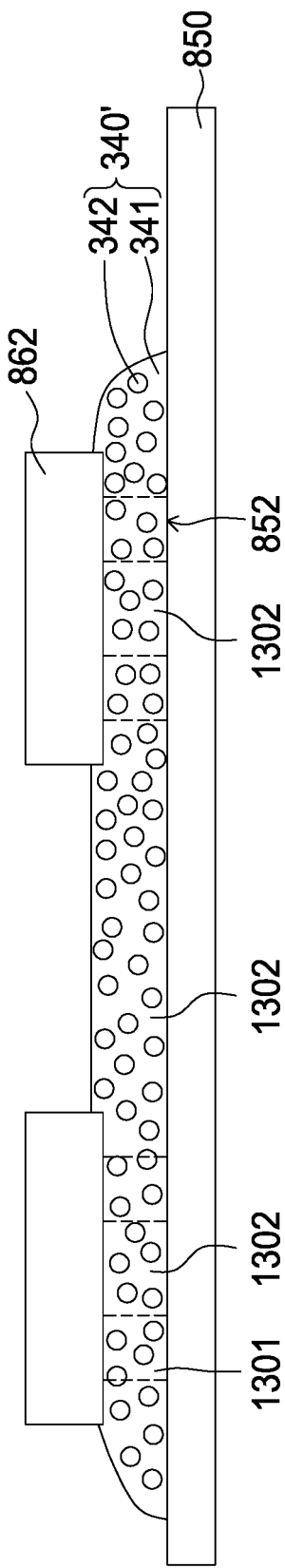
FIGS. 13A and 13B show the schematic views of the connection structure before and after curing in the light-emitting device in accordance with an embodiment of the present disclosure.
Figure 13B:
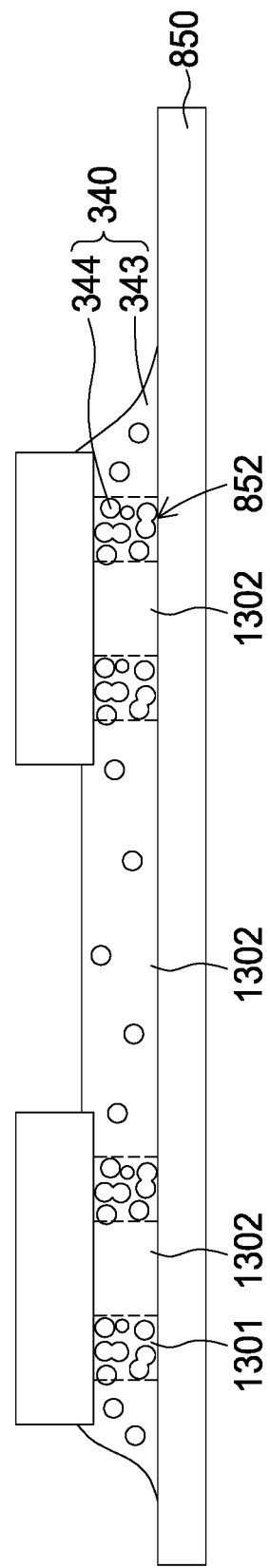

FIGS. 13A and 13B show the schematic views of the connection structure before and after curing in the light-emitting device in accordance with an embodiment of the present disclosure. Referring to FIG. 13A, the upper surface of the target substrate 850 has a plurality of conductive pads 852. Before curing, a glue (or referred as self-assembly glue) 340' is formed on and around the conductive pads 852, and the light-emitting elements 862 are formed on the conductive pads 852 and partially embedded in the glue 340'. In detail, the glue 340' includes resin 341 and electrically conductive particles 342 dispersed in the resin 341. A connection region 1301 is above the conductive pad 852 and below the light-emitting element 862, and non-connection region 1302 is between the conductive pads 852 and between the light-emitting elements 862. The structure, function and material of the glue 340', the resin 341 and the electrically conductive particles 342 can be referred to the corresponding paragraphs of FIG. 3B.

Referring to FIG. 13B, the connection structure 340 is formed after curing, and the electrically conductive particles 342 are melted and collected in the connection region 1301 and become the electrical connection portion 344. In addition, after the resin 341 is cured, it becomes the protective portion 343. In an embodiment, a small portion of the electrically conductive particles 342 are dispersed in the non-connection region 1302. The electrically conductive particles 342 in the non-connection region 1302 are partially separated from each other so that the problem of short circuit can be avoided.

FIGS. 14A and 14B show the schematic views of the connection structure before and after curing in the light-emitting device in accordance with another embodiment of the present disclosure. Referring to FIG. 14A, unlike FIG. 13A, the resins 341 are respectively formed under and around the two light-emitting elements 862 before curing so the resin 341 are separated from each other. Similarly, the non-connection region 1402 has two regions respectively corresponding to one of the light-emitting elements 862, and the two regions are separated from each other. The portion of the connection region 1401 is the same with that of FIG. 13A. After curing, referring to FIG. 14B, the structure, function and material of the connection structure 340, the protective portion 343, and the electrical connection portion 344 can be referred to the corresponding paragraphs of FIG. 13B.

FIGS. 15A to 15D show the diagrams of a manufacturing process of transferring a plurality of light-emitting elements to a target substrate in accordance with another embodiment of the present disclosure. Referring to FIG. 15A, an original substrate 1530 is provided, and a plurality of light-emitting elements 860 are included on the original substrate 1530. In addition, a target substrate 850 is provided, and the upper surface of the target substrate 850 has a plurality of conductive pads 852. In an embodiment, the original substrate 1530 includes a carrier 1532 and a releasable glue 1534. The releasable glue 1534 temporarily fixes the plurality of light-emitting elements 860 on the carrier 1532. The plurality of light-emitting elements 860 comprise two groups, one group being the selected light-emitting elements 862 and the other group being the unselected light-emitting elements 864. In an embodiment, each of the selected light-emitting elements 862 includes two contact electrodes 862a. The structure, function and material of the original substrate 1530, the light-emitting element 860, the selected light-emitting element 862, the unselected light-emitting element 864, the target substrate 850 and the conductive pad 852 can be referred to the corresponding paragraphs of FIGS. 8B and 8D.

Referring to FIG. 15B, the glue 340' is respectively formed on and around the conductive pads 852 and the selected light-emitting elements 862 are aligned with the conductive pads 852 having the glue 340'. The structure, function and material of the glue 340' can be referred to the corresponding paragraphs of FIG. 3B.

Referring to FIG. 15C, the selected light-emitting elements 862 are placed over the conductive pads 852 and energy E1 is provided to melt the electrically conductive particles (not shown) in the glue 340' and to cure the resin (not shown) in the glue 340'. The description of the energy E1, the resin, the electrically conductive particles, and the glue 340' of this step can be referred to the corresponding paragraphs of FIG. 3C, FIG. 8F, and FIGS. 13A to 14B.

Referring to FIG. 15D, the selected light-emitting elements 862 are formed on the target substrate 850 and separated from the transfer device. After the energy E1 radiates, the adhesiveness of the releasable glue 1534 is lowered, the glue 340' is converted into the connection structure 340, and the protective portion 343 and the electrical connection portion 344 are formed. The connection force of the connection structure 340 to the selected light-emitting element 862 is greater than the connection force of the releasable glue 1534 to the selected light-emitting element 862.

Figure 15E:
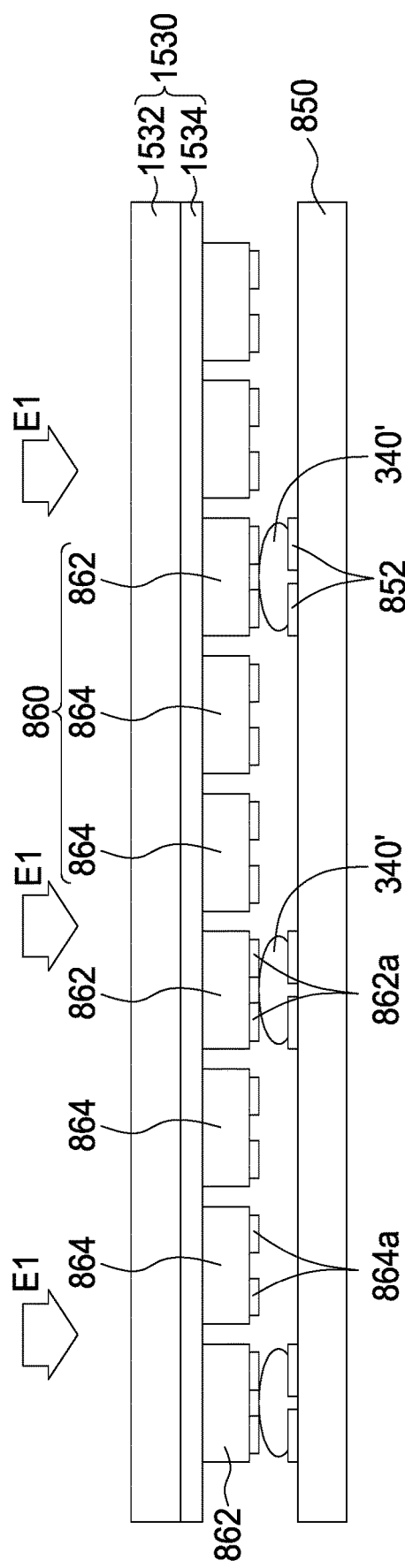

FIGS. 15A, 15B, 15E, and 15D show the diagrams of a manufacturing process of transferring a plurality of light-emitting elements to a target substrate in accordance with another embodiment of the present disclosure. After the process disclosed in FIG. 15B, the next process is shown in FIG. 15E. The difference between the process shown in FIG. 15E and the process shown in FIG. 15C is that the position at which the energy E1 radiates is the original substrate 1530. After the process disclosed in FIG. 15E, the subsequent process is shown in FIG. 15D.

Figure 15F:
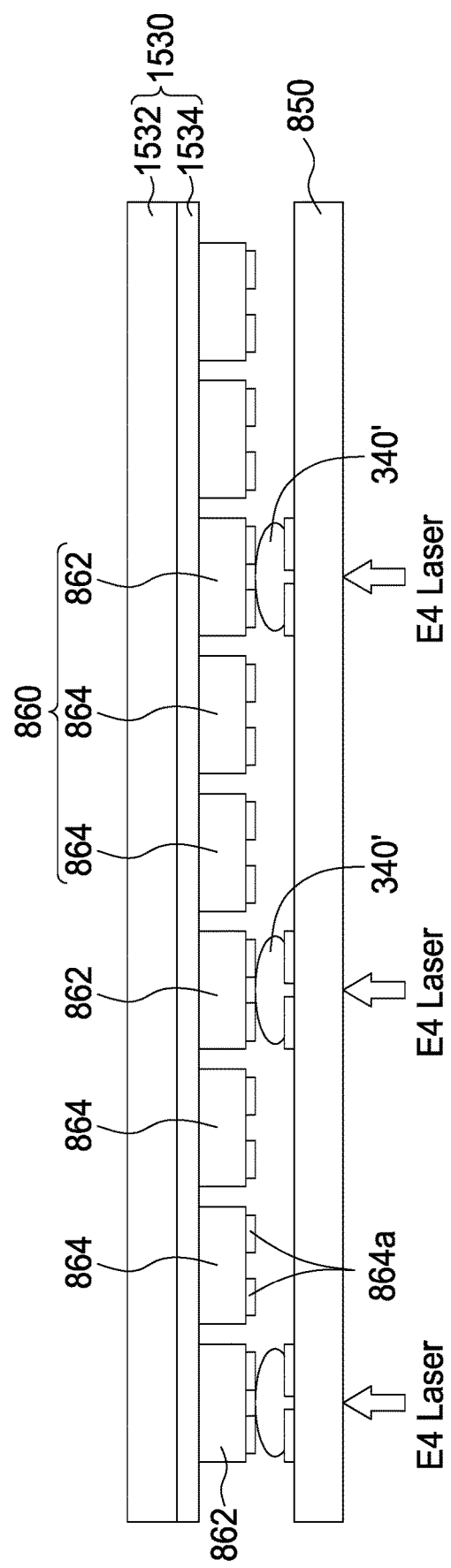

FIGS. 15A, 15B, 15F, and 15D show the diagrams of a manufacturing process of transferring a plurality of light-emitting elements to a target substrate in accordance with another embodiment of the present disclosure. After the process disclosed in FIG. 15B, the next process is shown in FIG. 15F. The difference between the process shown in FIG. 15F and the process shown in FIG. 15C is that the local areas are provided with the energy E4. In an embodiment, the energy E4 is provided by a laser so that heat can be provided in a local area, such as a connection area. After the process disclosed in FIG. 15F, the subsequent process is shown in FIG. 15D.

Figure 16A:
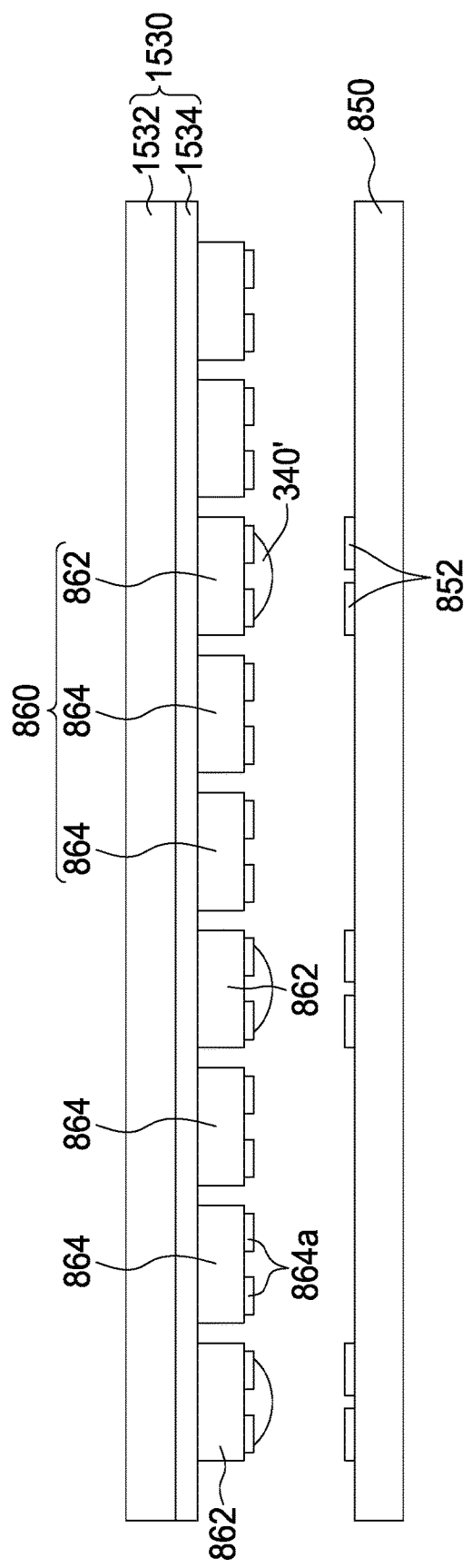
FIGS. 16A to 16C show the diagrams of a manufacturing process of transferring a plurality of light-emitting elements to a target substrate in accordance with another embodiment of the present disclosure.
Figure 16B:
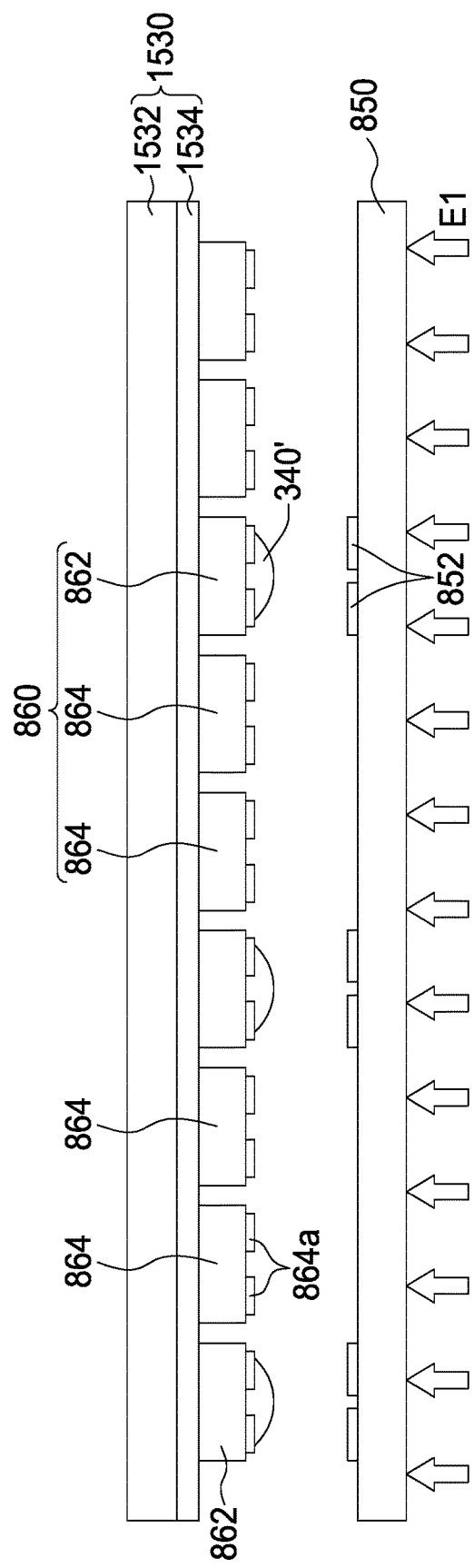
Figure 16C:
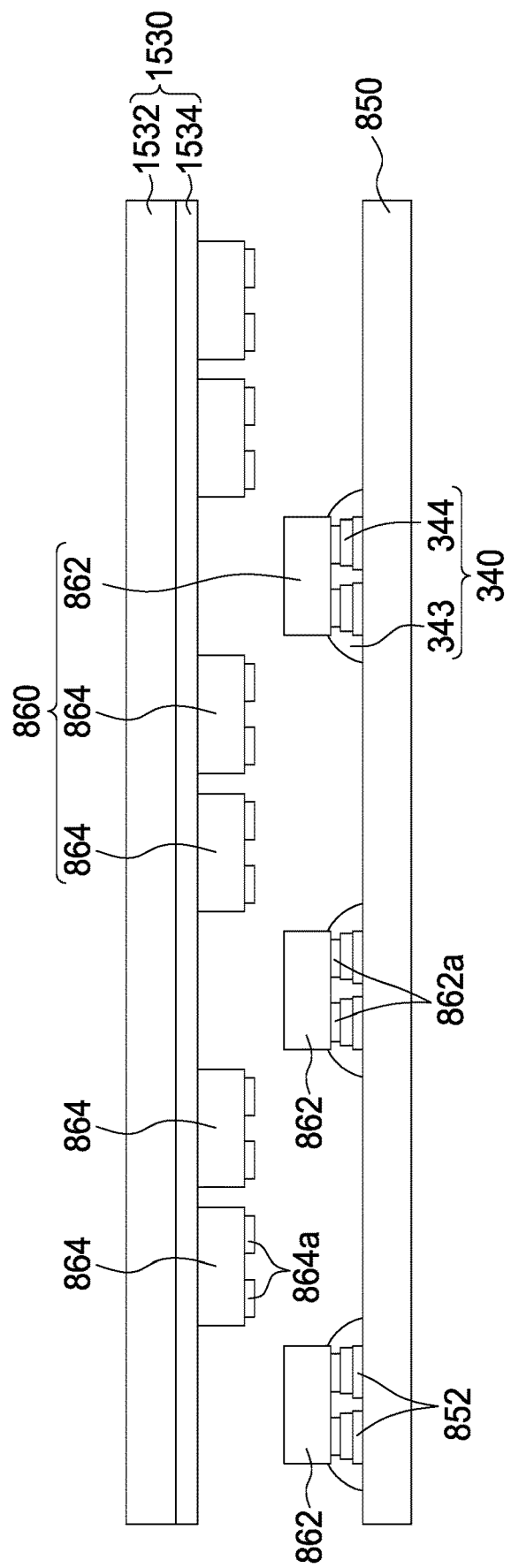

FIGS. 16A to 16C show the diagrams of a manufacturing process of transferring a plurality of light-emitting elements to a target substrate in accordance with another embodiment of the present disclosure. Referring to FIG. 16A, an original substrate 1530 is provided, and a plurality of light-emitting elements 860 is disposed on the original substrate 1530. In addition, the lower surfaces of the plurality of light-emitting elements 860 are covered by the glue 340'. Furthermore, a target substrate 850 is provided, and the upper surface of the target substrate 850 has a plurality of conductive pads 852. The structure, function, and material of the original substrate 1530, the light-emitting element 860, the target substrate 850, and the conductive pad 852 can be referred to the corresponding paragraphs of FIGS. 8B, 8D, and 15A.

Referring to FIG. 16B, the selected light-emitting elements 862 are placed on the conductive pads 852 and then an energy E1 is provided to melt the electrically conductive particles (not shown) in the glue 340' and to cure the resin (not shown) in the glue 340'. The related descriptions of the energy E1, the resin, the electrically conductive particles, and the glue 340' of this step can be referred to the corresponding paragraphs of FIG. 3C, FIG. 8F, and FIGS. 13A to 14B.

Referring to FIG. 16C, the selected light-emitting elements 862 are formed on the target substrate 850 and separated from the transfer device. The related descriptions of this step can be referred to the corresponding paragraphs of FIG. 15D.

Figure 16D:
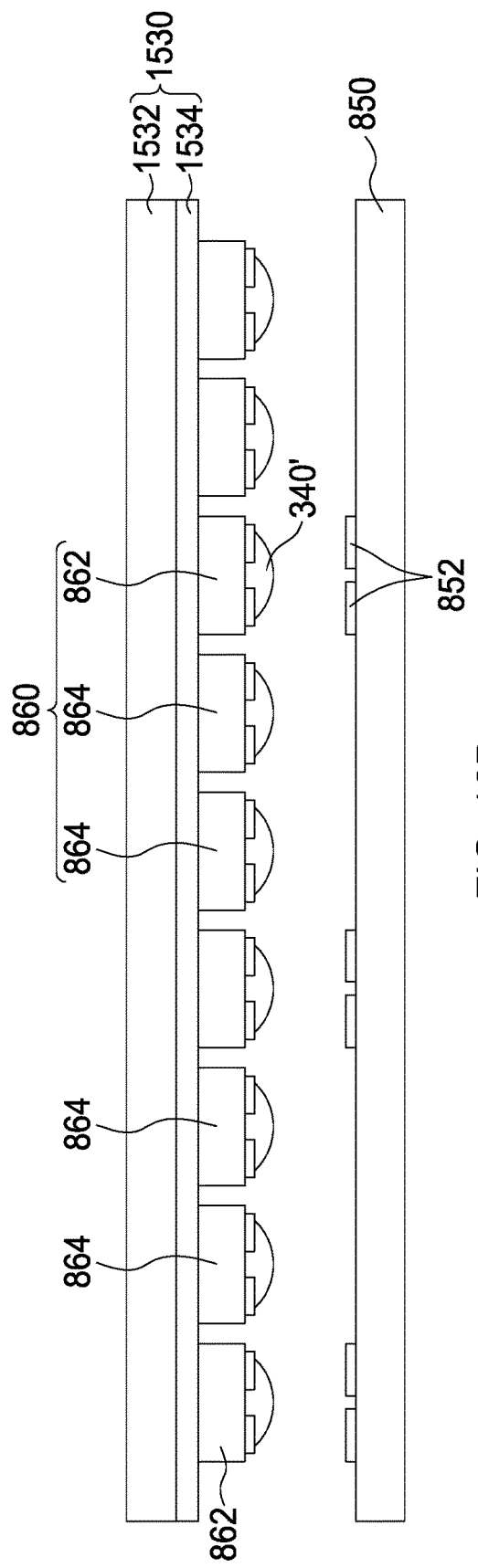
Figure 16E:
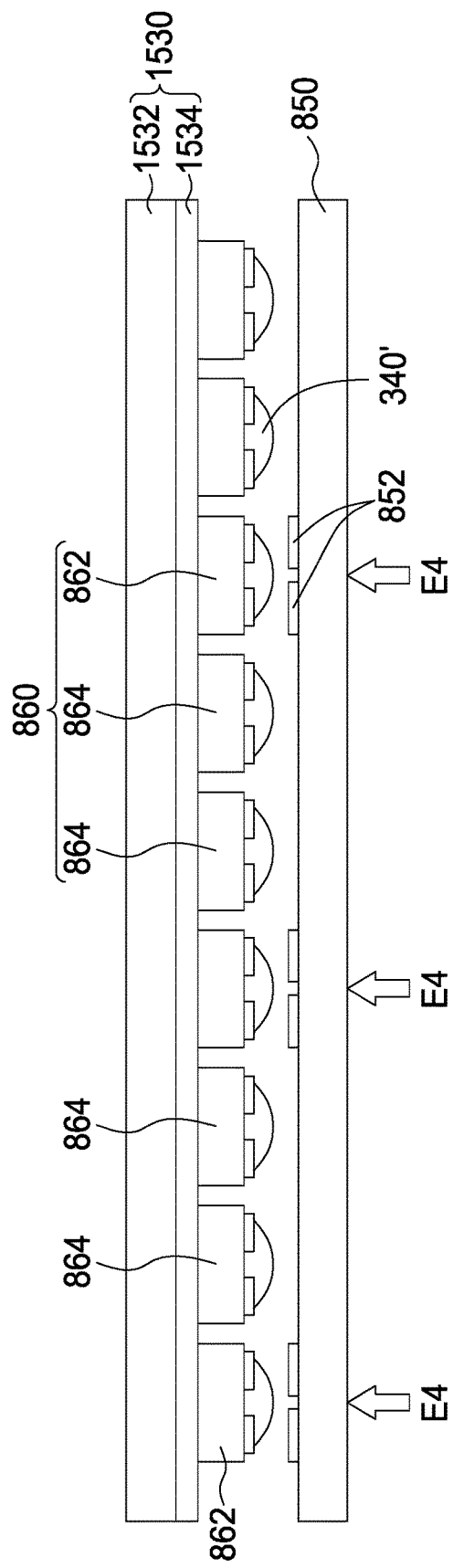

FIGS. 16D, 16E, and 16C show the diagrams of a manufacturing process of transferring a plurality of light-emitting elements to a target substrate in accordance with another embodiment of the present disclosure. Referring to FIG. 16D, an original substrate 1530 is provided and a plurality of light-emitting elements 860 is disposed on the original substrate 1530. The lower surfaces of the plurality of light-emitting elements 860 are covered by the glue 340'. Furthermore, a target substrate 850 is provided and a plurality of conductive pads 852 is formed on the upper surface of the target substrate. The structure, function, and material of the original substrate 1530, the light-emitting element 860, the target substrate 850, and the conductive pad 852 can be referred to the corresponding paragraphs of FIGS. 8B, 8D, and 15A.

Referring to FIG. 16E, energy E4 is provided in a local area to melt the electrically conductive particles (not shown) in the glue 340' and to cure the resin (not shown) in the glue 340'. In an embodiment, the energy E4 can be provided by a laser. The descriptions of the energy E4, the resin, the electrically conductive particle, and the glue 340' of this step can be referred to the corresponding paragraphs of FIGS. 3C, 8F, 13A to 14B, and 15F. After the process shown in FIG. 16E is performed, the subsequent process is shown in FIG. 16C.

Figure 17A:
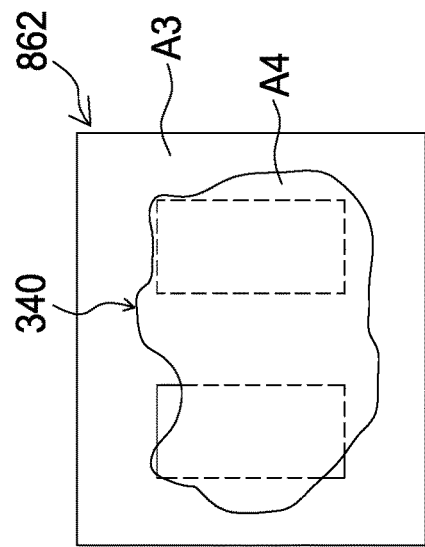
FIG. 17A shows a bottom view of a light-emitting element in accordance with an embodiment of the present disclosure.
Figure 17B:
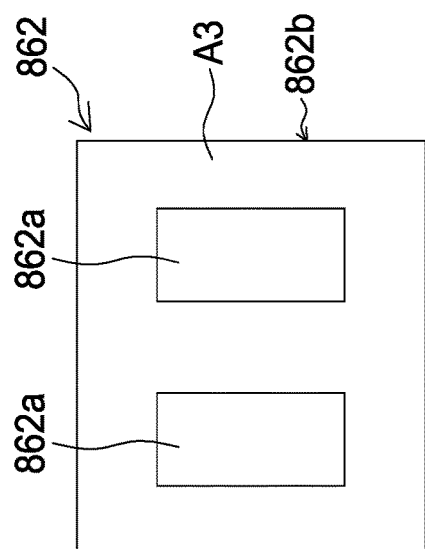
FIG. 17B shows a bottom view of a light-emitting element covering the connection structure in accordance with an embodiment of the present disclosure.
Figure 17C:
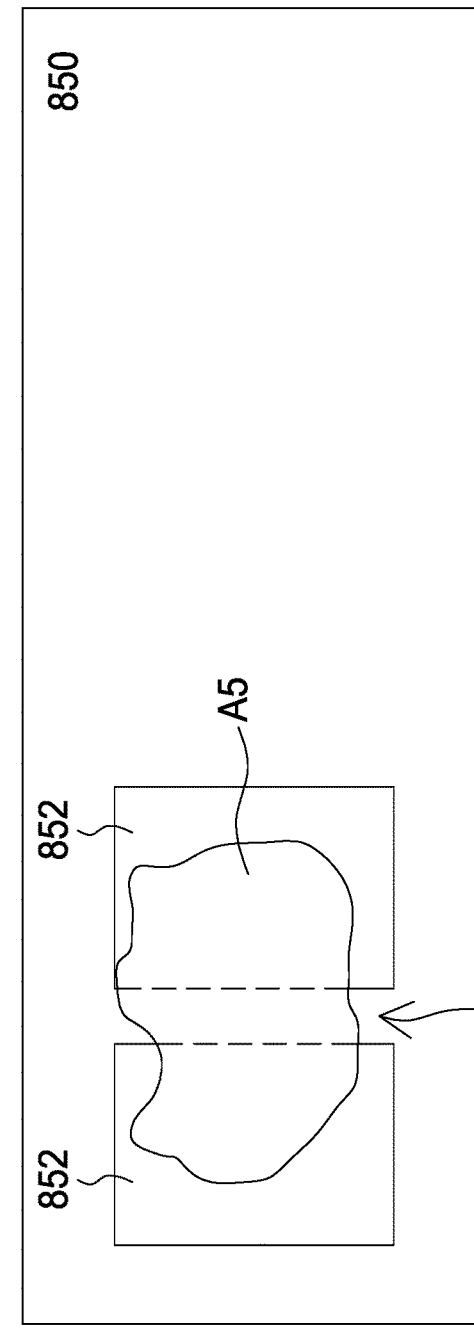
FIG. 17C shows a bottom view of a target substrate covering the connection structure in accordance with an embodiment of the present disclosure.

FIG. 17A shows a bottom view of a light-emitting element in accordance with an embodiment of the present disclosure. FIG. 17B shows a bottom view of a light-emitting element covering the connection structure in accordance with an embodiment of the present disclosure. FIG. 17C shows a bottom view of a target substrate on which the connection structure is formed in accordance with an embodiment of the present disclosure. FIGS. 17A to 17C can be referred to the relationships between the light-emitting element, the connection structure, and the target substrate in any of the embodiments disclosed in the present disclosure.

Referring to FIG. 17A, a bottom view of the selected light-emitting element 862 includes two contact electrodes 862*a* and a boundary 862*b*. The area enclosed by the boundary 862*b* is A3.

Referring to FIG. 17B, the connection structure 340 covers a portion of the bottom surface of the selected light-emitting element 862. In addition, the area of the selected light-emitting element 862 covered by the connection structure 340 is A4. In an embodiment, the ratio of area A4 to area A3 is between 60% to 80%. If the ratio of the area A4 to the area A3 is greater than 80%, while the connection structure 340 is in uncured state, the glue 340' may stick to the adjacent unselected light-emitting element 864 and cause the unselected light-emitting element 864 be transferred to the target substrate during the transferring process disclosed in aforementioned embodiments.

Referring to FIG. 17C, the connection structure 340 covers a portion of the bottom surface of the conductive pad 852. The area that the connection structure 340 covers the selected conductive pad 852 is A5. In an embodiment, the ratio of area A5 to area A3 is between 60% to 80%. If the ratio of the area A5 to the area A3 is greater than 80%, while the connection structure 340 is in uncured state, the glue 340' may stick to the adjacent unselected light-emitting element 864 and cause the unselected light-emitting element 864 be transferred to the target substrate during the transferring process disclosed in aforementioned embodiments.

Figure 18C:
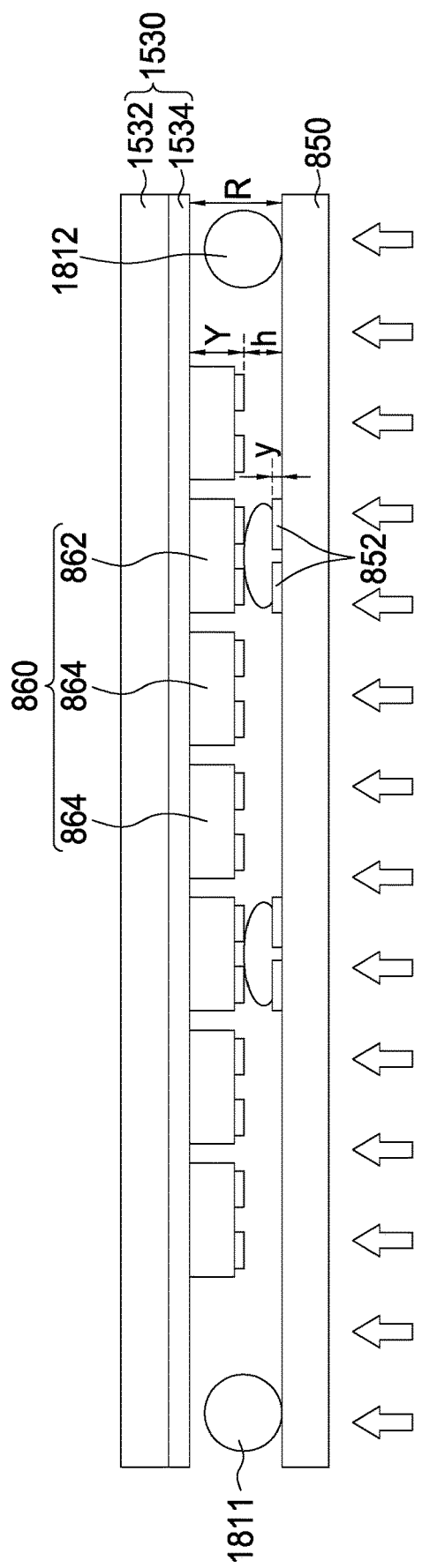

FIGS. 18A to 18D show the diagrams of a manufacturing process of transferring a plurality of light-emitting elements to a target substrate in accordance with another embodiment of the present disclosure. Referring to FIG. 18A, the difference from FIG. 15A is that interval pieces 1811 and 1812 exist between the original substrate 1530 and the target substrate 850. In an embodiment, the interval pieces 1811, 1812 are on the target substrate 850 and at the edge of the target substrate 850, for example, four corners. In another embodiment, the interval pieces 1811, 1812 can be in other areas on the target substrate 850, for example, an intermediate area. In an embodiment, the interval pieces 1811, 1812 are in the shape of sphere. In other embodiments, the interval pieces 1811, 1812 may be in the shape of pillar, cuboid or cone. The number of interval pieces 1811, 1812 can be adjusted as needed. The description of other features in FIG. 18A can be referred to the corresponding paragraphs of FIG. 15A.

Referring to FIG. 18B, the glues 1840'-1 are respectively formed on and around the conductive pads 852 and the selected light-emitting elements 862 are aligned with the conductive pads 852 having the glue 1840'-1. For the structure, function and material of the glue 1840'-1 can be referred to the corresponding paragraphs of FIG. 3B.

Referring to FIG. 18C, the selected light-emitting elements 862 are placed over the conductive pad 852 and an energy E1 is provided to melt the electrically conductive particles (not shown) in the glue 1840'-1 and to cure the resin (not shown) in the glue 1840'-1. The interval between the original substrate 1530 and the target substrate 850 is limited by the diameter R of the interval pieces 1811, 1812. Therefore, the introduction of the interval pieces 1811, 1812 can provide a more uniform interval between the original substrate 1530 and the target substrate 850. In other words, the thickness Y of the selected light-emitting element 862 is fixed, therefore the distance h between the light-emitting element 862 and the target substrate 850 can be fixed because R=Y+h. The related description of the energy E1, the resin, the electrically conductive particles, and the glue 1840'-1 of this step can be referred to the corresponding paragraphs of FIG. 3C, FIG. 8F, and FIGS. 13A to 14B.

Figure 18D:
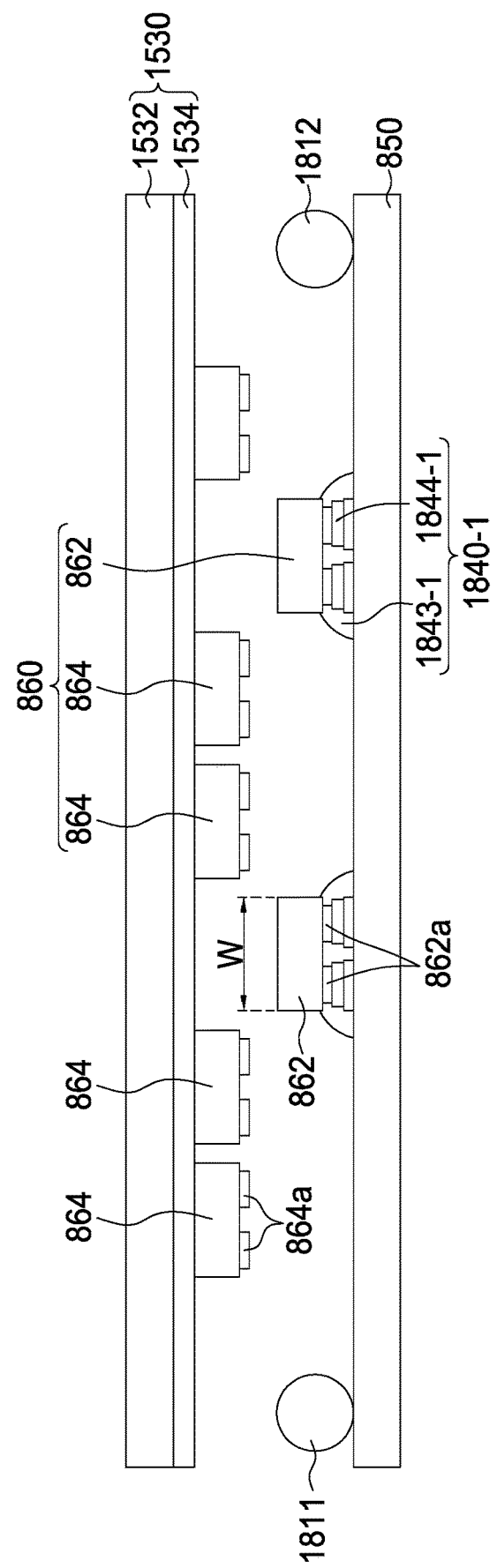
Figure 18I:
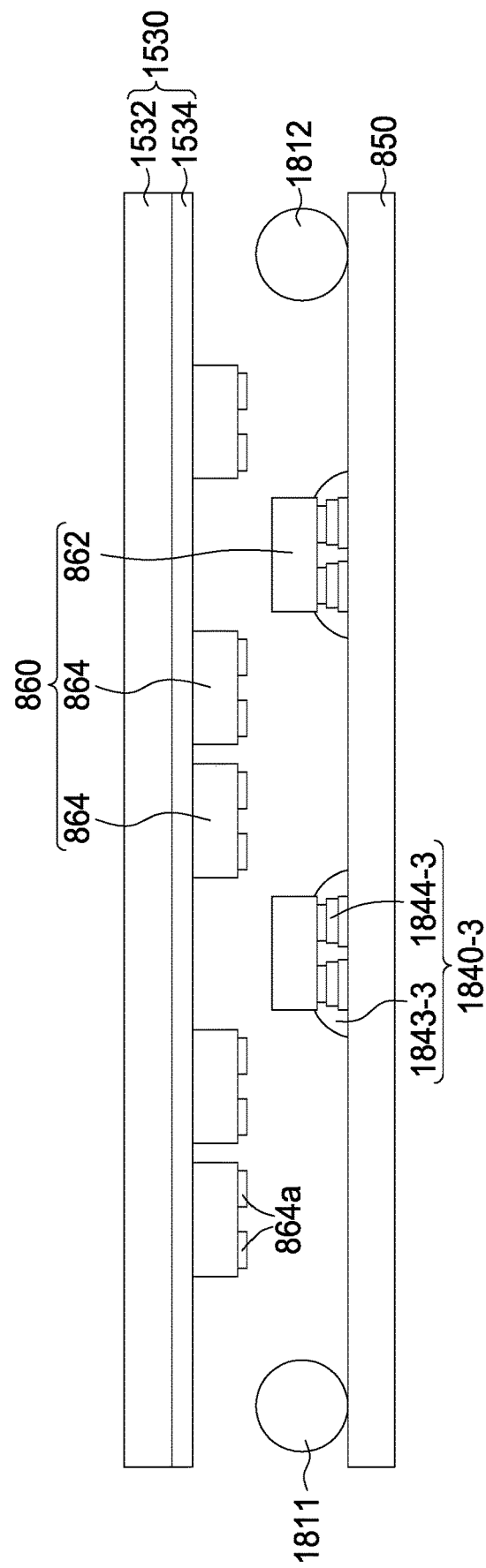

Referring to FIG. 18D, the selected light-emitting elements 862 are formed on the target substrate 850 and separated from the transfer device. The related description of this step can be referred to the corresponding paragraphs of FIG. 15D.

FIGS. 18A, 18B, 18E to 18F show the diagrams of a manufacturing process of transferring a plurality of light-emitting elements to a target substrate in accordance with another embodiment of the present disclosure. FIG. 18E is followed after FIG. 18B, FIG. 18E is similar to FIG. 18C, and FIG. 18F is similar to FIG. 18D. Referring to FIG. 18E, in an embodiment, the glue 1840'-2 is formed on and around the conductive pad 852, and the width of the glue 1840'-2 is greater than the width W of the light-emitting element 860 and smaller than the width W of the light-emitting element 860 plus the distance d between the light-emitting elements 860. Referring to FIG. 18F, after melting the electrically conductive particles (not shown) in the glue 1840'-2 and curing the resin (not shown) in the glue 1840'-2, the width of the connection structure 1840-2 is smaller than the width W of the light-emitting element 860 plus the distance d between the light-emitting elements 860. Therefore it can avoid the connection structure (glue) 1840-2 may stick to the adjacent unselected light-emitting element 864 in the uncured state and cause the unselected light-emitting element 864 be transferred to the target substrate during the transferring process disclosed in aforementioned embodiments.

FIGS. 18A, 18G to 18I show the diagrams of a manufacturing process of transferring a plurality of light-emitting elements to a target substrate in accordance with another embodiment of the present disclosure. The process shown in FIG. 18G is followed after the process disclosed in FIG. 18A. Referring to FIG. 18G, the difference between FIG. 18G and FIG. 18B is that the glue 1840'-3 is first formed on the selected light-emitting element 862. After that, the process shown in FIG. 18H is similar to the process shown in FIG. 18C, and the process shown in FIG. 18F is similar to the process shown in FIG. 18D.

FIGS. 19A to 19B show the schematic views of the connection structure before and after curing in the light-emitting device disclosed in FIGS. 18A to 18D. FIG. 19A shows that glue (or referred as self-assembly glue) 1840'-1 is formed on and around the conductive pad 852 before curing (low temperature), and the bottom surface portion of the light-emitting element 862 is embedded in the glue 1840'-1. Since no downward pressing force is provided, the glue 1840'-1 only covers the bottom surface of the light-emitting element 862 and does not cover the side surface of the light-emitting element 862. Besides, the electrically conductive particles 1842-1 are substantially uniformly dispersed in the resin 1841-1. A connection region 1901 is above the conductive pad 852 and below the light-emitting element 862, and non-connection region 1902 is between the conductive pads 852 and between the light-emitting elements 862. The density of the electrically conductive particles 1842-1 in the connection region 1901 and the non-connection region 1902 are substantially the same.

FIG. 19B shows that the glue 1840'-1 forms a connection structure 1840-1 after curing (at a high temperature). Similarly, the connection structure 1840-1 only covers the bottom surface of the light-emitting element 862 and does not cover the side surface of the light-emitting element 862. However, the density of the electrically conductive particles 1842-1 in the connection region 1901 is greater than the density in the non-connection region 1902.

FIG. 19C shows a top view of a light-emitting device disclosed in FIG. 18D. In an embodiment, the area A(P) of the connection structure 1840-1 is smaller than the area A(C) of the light-emitting element 862 on the target substrate 850. In an embodiment, the area A(S) of the electrical connection portion 1844-1 is larger than the area A(E) of the contact electrode 862a.

Figure 19D:
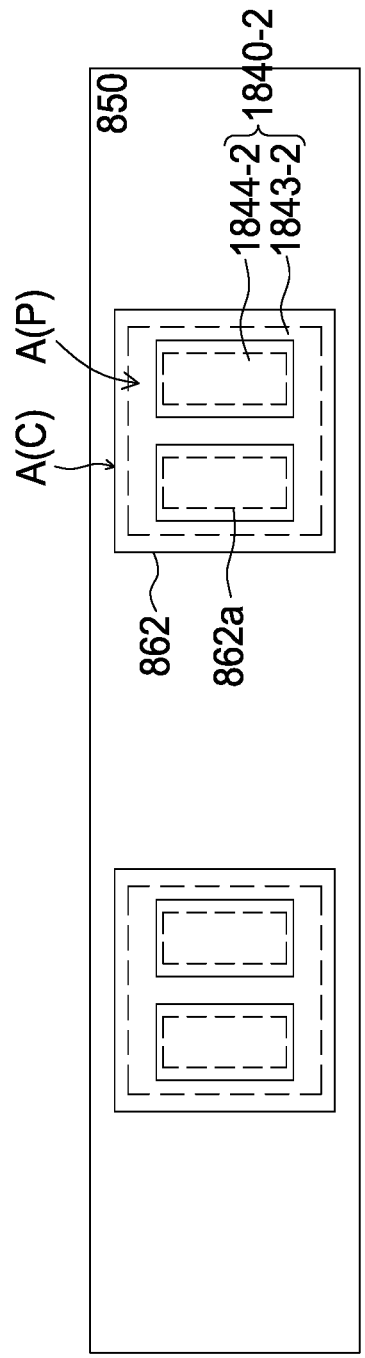
FIG. 19D shows a top view of a light-emitting device disclosed in FIG. 18F.

FIG. 19D shows a top view of a light-emitting device disclosed in FIG. 18F. In an embodiment, the area A(P) of the connection structure 1840-2 is larger than the area A(C) of the light-emitting element 862 on the target substrate 850.

The embodiments described above are merely illustrative of the technical spirit and the features of the present disclosure, and the objects of the present invention can be understood by those skilled in the art, and the scope of the present disclosure cannot be limited thereto. That is, the equivalent changes or modifications made by the spirit of the present disclosure should still be covered by the patent of the present disclosure.

What is claimed is:

1. A light-emitting device, comprising:
a substrate, having a conductive pad;
a first light-emitting element, comprising a bottom surface, and a first contact electrode and a second contact electrode which are arranged under the bottom surface; and
a connection structure, comprising a first electrical connection portion, a second electrical connection portion, and a protective portion, wherein the first electrical connection portion electrically connects the first contact electrode and the conductive pad, the second electrical connection portion electrically connects the second contact electrode and the conductive pad, and the protective portion surrounds the first contact electrode, the second contact electrode, the first electrical connection portion, and the second electrical connection portion;
wherein, the protective portion and the bottom surface have an interface with a maximum width smaller than that of the first light-emitting element.

2. The light-emitting device of claim 1, wherein the first light-emitting element has an outermost surface which is not covered by the protective portion.

3. The light-emitting device of claim 1, wherein, in a bottom view, the connection structure has an area smaller than that of the first light-emitting element.

4. The light-emitting device of claim 1, wherein the protective portion comprises thermosetting polymer.

5. The light-emitting device of claim 1, wherein the protective portion comprises epoxy resin.

6. The light-emitting device of claim 1, wherein, in a top view, the first electrical connection portion has an area larger than that of the first contact electrode.

7. The light-emitting device of claim 1, further comprising a second light-emitting element arranged on the substrate without being connected to the protective portion.

8. The light-emitting device of claim 1, wherein the first electrical connection portion includes tin (Sn) or indium (In).

9. The light-emitting device of claim 1, wherein the protective portion is directly connected to the first contact electrode, the second contact electrode, the first electrical connection portion, the second electrical connection portion, and the conductive pad.

10. The light-emitting device of claim 1, wherein the protective portion has a portion filled into a space among the first light-emitting element, the first electrical connection portion, the second electrical connection portion, and the substrate.

11. A display device, comprising:
a light-emitting device, as a pixel in the display device, comprising:
a substrate, having a conductive pad;
a first light-emitting element, comprising a bottom surface, and a first contact electrode and a second contact electrode which are arranged under the bottom surface; and
a connection structure, comprising a first electrical connection portion, a second electrical connection portion, and a protective portion, wherein the first electrical connection portion electrically connects the first contact electrode and the conductive pad, the second electrical connection portion electrically connects the second contact electrode and the conductive pad, and the protective portion surrounds the first contact electrode, the second contact electrode, the first electrical connection portion, and the second electrical connection portion;

wherein, the protective portion and the bottom surface have an interface with a maximum width smaller than that of the first light-emitting element.

12. The display device of claim 11, wherein the first light-emitting element has an outermost surface which is not covered by the protective portion.

13. The display device of claim 11, wherein, in a bottom view, the connection structure has an area smaller than that of the first light-emitting element.

14. The display device of claim 11, wherein, in a top view, the first electrical connection portion has an area larger than that of the first contact electrode.

15. The display device of claim 11, further comprising a second light-emitting element arranged on the substrate without being connected to the protective portion.

16. The display device of claim 11, wherein the protective portion is directly connected to the first contact electrode, the second contact electrode, the first electrical connection portion, the second electrical connection portion, and the conductive pad.

17. The display device of claim 11, wherein the protective portion has a portion filled into a space among the first light-emitting element, the first electrical connection portion, the second electrical connection portion, and the substrate.

* * * * *